(12) United States Patent
Lee et al.

(10) Patent No.: US 12,342,692 B2
(45) Date of Patent: Jun. 24, 2025

(54) DISPLAY DEVICE, ELECTRONIC DEVICE, AND FABRICATING METHOD OF THE DISPLAY DEVICE

(71) Applicant: Samsung Display Co., Ltd., Yongin-Si (KR)

(72) Inventors: Dongmin Lee, Gyeonggi-do (KR); Hyuneok Shin, Seoul (KR); Juhyun Lee, Gyeonggi-do (KR); Hyunah Sung, Gyeonggi-do (KR)

(73) Assignee: Samsung Display Co., Ltd., Yongin-si (KR)

( * ) Notice: Subject to any disclaimer, the term of this patent is extended or adjusted under 35 U.S.C. 154(b) by 559 days.

(21) Appl. No.: 17/748,217

(22) Filed: May 19, 2022

(65) Prior Publication Data

US 2023/0082757 A1    Mar. 16, 2023

(30) Foreign Application Priority Data

Sep. 13, 2021  (KR) .................. 10-2021-0121873

(51) Int. Cl.
| | |
|---|---|
| H10K 59/131 | (2023.01) |
| H10K 59/65 | (2023.01) |
| H10K 71/00 | (2023.01) |
| G09G 3/32 | (2016.01) |
| H10K 59/12 | (2023.01) |

(52) U.S. Cl.
CPC .......... *H10K 59/131* (2023.02); *H10K 59/65* (2023.02); *H10K 71/00* (2023.02); *G09G 3/32* (2013.01); *G09G 2300/0819* (2013.01); *G09G 2300/0842* (2013.01); *H10K 59/1201* (2023.02)

(58) Field of Classification Search
CPC ... H10K 59/123; H10K 59/124; H10K 59/131
See application file for complete search history.

(56) References Cited

U.S. PATENT DOCUMENTS

| | | | | |
|---|---|---|---|---|
| 4,803,528 | A * | 2/1989 | Pankove | ............... H01L 21/314 257/E21.432 |
| 11,138,927 | B2 | 10/2021 | Jung et al. | |
| 2013/0105206 | A1 | 5/2013 | Kim et al. | |
| 2014/0120027 | A1 | 5/2014 | Tanabe et al. | |

FOREIGN PATENT DOCUMENTS

| | | |
|---|---|---|
| CN | 111063719 A | 4/2020 |
| JP | 2005-140906 A | 6/2005 |
| KR | 10-2013-0046728 A | 5/2013 |
| KR | 10-2014-0014292 A | 2/2014 |
| KR | 10-2017-0113066 A | 10/2017 |

* cited by examiner

*Primary Examiner* — Mark V Prenty
(74) *Attorney, Agent, or Firm* — Innovation Counsel LLP

(57) ABSTRACT

Provided is a display device including a display panel including a base layer including a display region which includes a first region and a second region disposed adjacent to the first region, a plurality of insulating layers disposed on the base layer, and a first pixel and a second pixel disposed on the base layer, wherein the first pixel includes a first light-emitting element disposed in the first region, a first pixel circuit electrically connected to the first light-emitting element, and a wiring layer disposed on at least one insulating layer and containing a conductive polymer, and the wiring layer includes a conductive portion which electrically connects the first pixel circuit and the first light-emitting element, and an insulating portion disposed adjacent to the conductive portion.

16 Claims, 13 Drawing Sheets

DISPLAY DEVICE, ELECTRONIC DEVICE, AND FABRICATING METHOD OF THE DISPLAY DEVICE

CROSS-REFERENCE TO RELATED APPLICATIONS

This U.S. non-provisional patent application claims priority under 35 U.S.C. § 119 to Korean Patent Application No. 10-2021-0121873, filed on Sep. 13, 2021, the entire contents of which are hereby incorporated by reference.

BACKGROUND

The present disclosure herein relates to a display device and a method of fabricating the same, and more particularly, to a display device having improved transmittance in some regions and improved reliability.

An electronic device may include various electronic components such as a display panel that displays an image and an electronic module that performs various functions. The display panel includes a light-emitting element that generates light.

The electronic module may include a camera, an infrared sensor, a proximity sensor, and the like. The electronic module may be disposed under a display panel. The transmittance of some regions of the display panel may be higher than that of some other regions of the display panel. The electronic module may receive or output an optical signal through a region having a high transmittance.

SUMMARY

The present disclosure provides a display device with a module, such as a sensor and a camera, having improved performance, and an electronic device including the same.

The present disclosure also provides a method of fabricating a display device capable of preventing the performance degradation of a module such as a sensor and a camera.

An embodiment of the inventive concept provides a display device including a display panel, the display panel including: a base layer including a display region, which includes a first region and a second region disposed adjacent to the first region, and a peripheral region disposed adjacent to the display region; a plurality of insulating layers disposed on the base layer; and a first pixel and a second pixel which are disposed on the base layer, wherein: the first pixel includes a first light-emitting element disposed in the first region, a first pixel circuit electrically connected to the first light-emitting element, and a wiring layer disposed on at least one insulating layer among the plurality of insulating layers and containing a conductive polymer; the second pixel includes a second light-emitting element disposed in the second region and a second pixel circuit electrically connected to the second light-emitting element and disposed in the second region; and the wiring layer includes a conductive portion, which electrically connects the first pixel circuit and the first light-emitting element, and an insulating portion disposed adjacent to the conductive portion.

In an embodiment, the conductive polymer may include at least one of polyethylenedioxythiophene (PEDOT), polythiophene, polyaniline, polypyrrole, or polyacetylene.

In an embodiment, the conductive portion may contain the conductive polymer, and the insulating portion may contain an insulation material which is an oxidized conductive polymer.

In an embodiment, the difference between the transmittance of the conductive portion and the transmittance of the insulating portion may be less than about 5%.

In an embodiment, the conductive portion and the insulating portion may be disposed on the same layer using a same process, and the upper surface of the conductive portion and the upper surface of the insulating portion may define a flat surface.

In an embodiment, in the wiring layer, the conductive portion and the insulating portion may be an integrally formed single layer.

In an embodiment, the plurality of insulating layers may include a lower insulating layer disposed under the wiring layer and an upper insulating layer disposed above the wiring layer and covering the wiring layer.

In an embodiment, the first pixel circuit may further include a transistor disposed in the second region and a connection electrode electrically connected to the transistor, wherein a portion of the connection electrode may be disposed on the upper insulating layer and connected to the conductive portion through a contact hole passing through the upper insulating layer.

In an embodiment, the transistor may include a semiconductor pattern disposed under the lower insulating layer and including a drain region, an active region, and a source region, and the conductive portion may be electrically connected to the semiconductor pattern.

In an embodiment, the first light-emitting element may include a first electrode disposed on the upper insulating layer, a light-emitting layer disposed on the first electrode, and a second electrode disposed on the light-emitting layer, and the conductive portion may be electrically connected to the first electrode.

In an embodiment, the display region may further include a third region disposed adjacent to the second region, the display panel may further include a third pixel disposed in the third region, the third pixel may include a third light-emitting element disposed in the third region and a third pixel circuit electrically connected to the third light-emitting element and disposed in the third region, and the number of the second light-emitting elements disposed in a unit area may be smaller than the number of the third light-emitting elements disposed in the unit area.

In an embodiment, the wiring layer may overlap the first region.

In an embodiment of the inventive concept, an electronic device includes: a display device including a display region, which includes a first region through which an optical signal passes and a second region disposed adjacent to the first region, and a peripheral region disposed adjacent to the display region; and an electronic module which is disposed under the display device, overlaps the first region, and receives the optical signal, wherein: the display device includes a base layer, a plurality of insulating layers disposed above the base layer, and a first pixel disposed on the base layer; the first pixel includes a first light-emitting element disposed in the first region, a first pixel circuit electrically connected to the first light-emitting element, and a wiring layer disposed on at least one insulating layer among the plurality of insulating layers and containing a conductive polymer; and the wiring layer includes a conductive portion, which electrically connects the first pixel circuit and the first light-emitting element, and an insulating portion disposed adjacent to the conductive portion.

In an embodiment, the conductive portion may include the conductive polymer and the insulating portion may include an insulation material which is an oxidized conductive polymer.

In an embodiment, the conductive portion and the insulating portion may be disposed on the same layer using a same process, and the upper surface of the conductive portion and the upper surface of the insulating portion may define a flat surface.

In an embodiment, the electronic module may include a camera module.

In an embodiment of the inventive concept, a method for fabricating a display device includes forming the first transistor in the second region, forming a lower insulating layer on the first transistor, forming a wiring layer on the lower insulating layer, at least a portion of the wiring layer being electrically connected to the first transistor, and forming the first light-emitting element electrically connected to the wiring layer, wherein: the forming of the wiring layer includes coating a conductive polymer on the lower insulating layer to form a preliminary wiring layer, forming a mask pattern on a portion of the preliminary wiring layer, and applying an insulation-imparting material onto the preliminary wiring layer exposed by the mask pattern; and the wiring layer includes a conductive portion containing the conductive polymer, and an insulating portion containing an insulation material which is an oxidized conductive polymer.

In an embodiment, the forming of the wiring layer may further include removing the mask pattern after applying an insulation-imparting material onto the preliminary wiring layer exposed by the mask pattern.

In an embodiment, in the forming of the wiring layer, the conductive portion may be formed under a portion in which the mask pattern is formed, and the insulating portion may be formed in a portion exposed by the mask patterns.

In an embodiment, the insulation-imparting material may be an oxidizing agent that oxidizes the conductive polymer.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

Figure 7A:
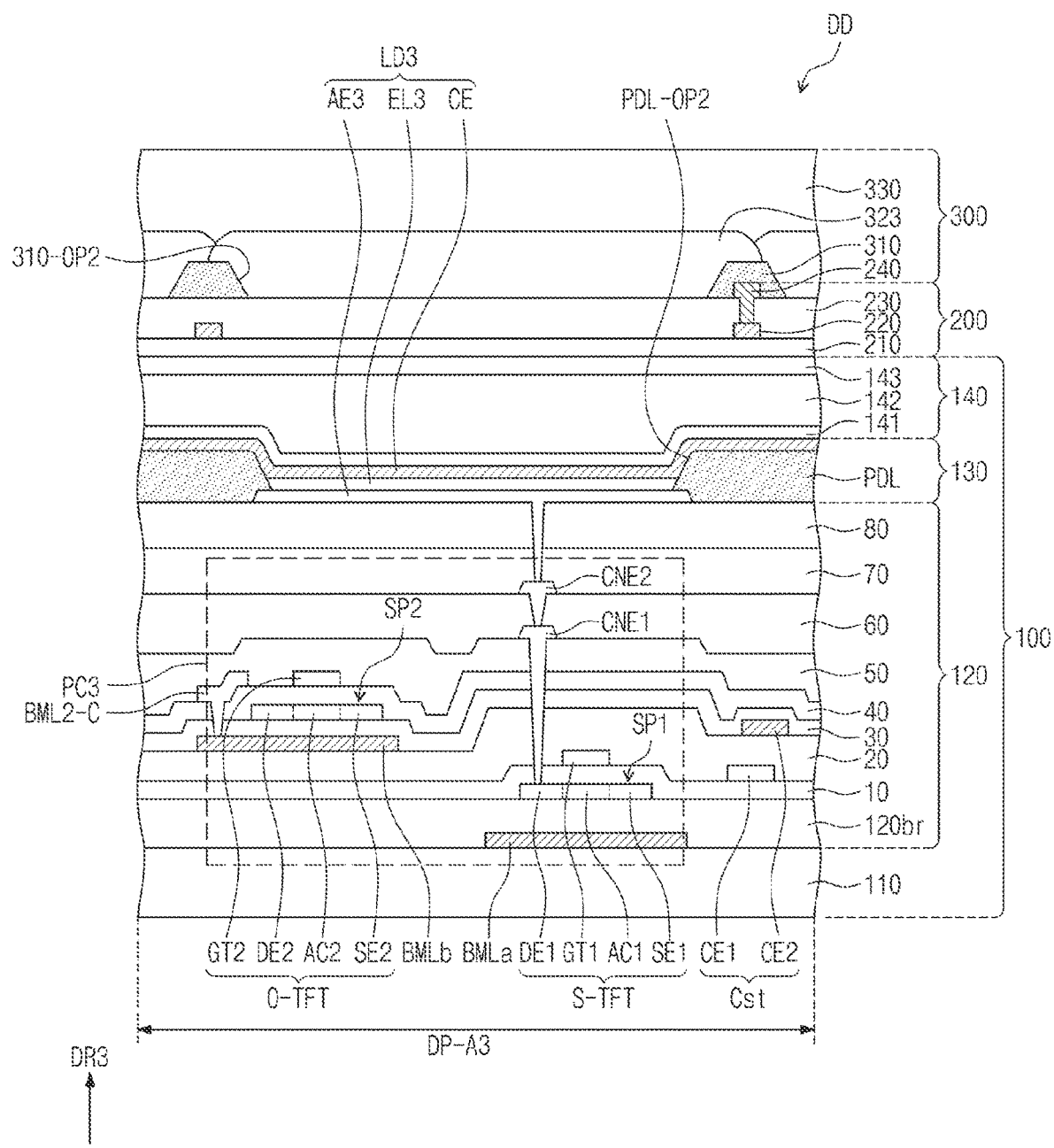
Figure 7B:
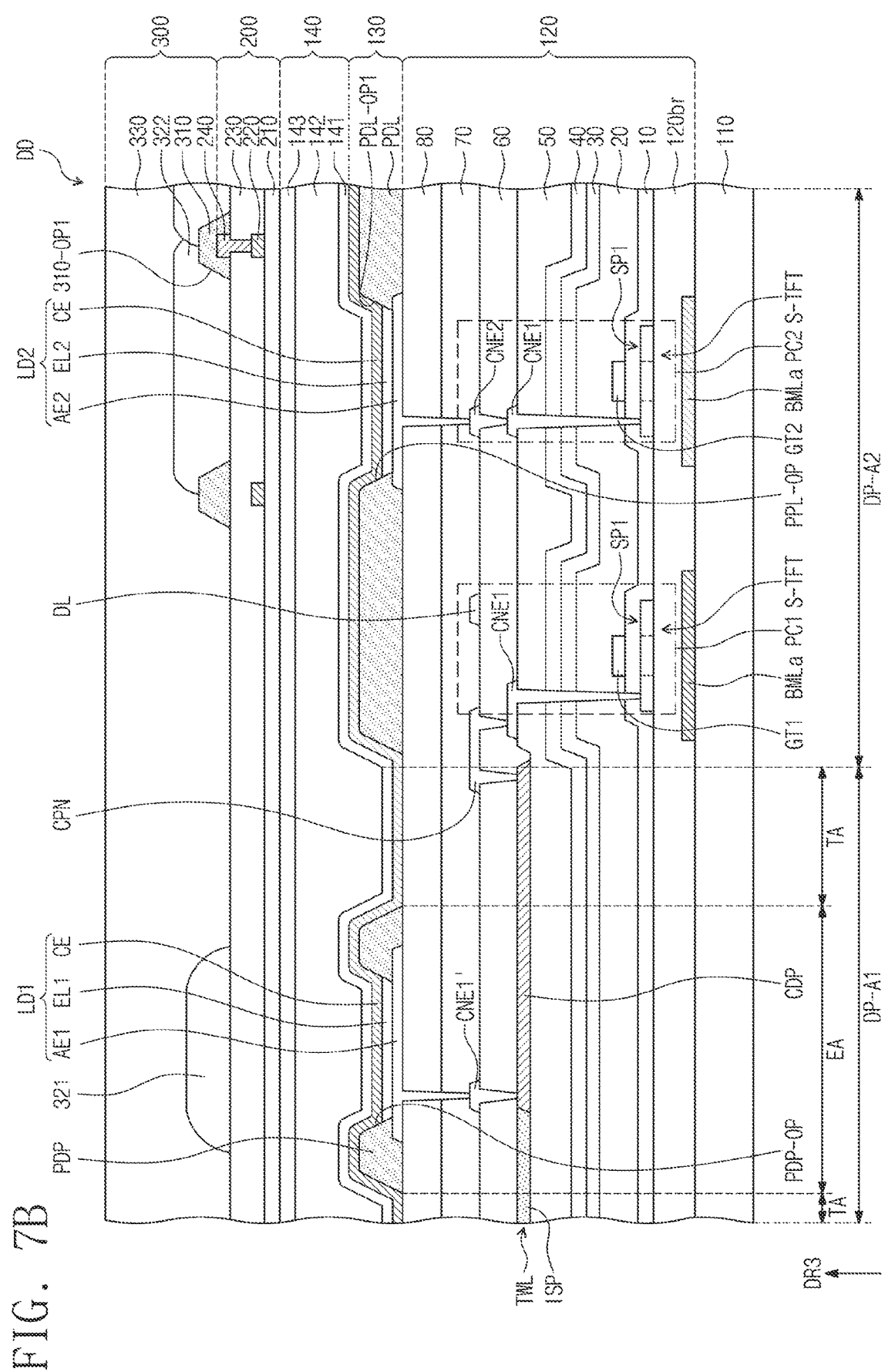
Figure 8A:
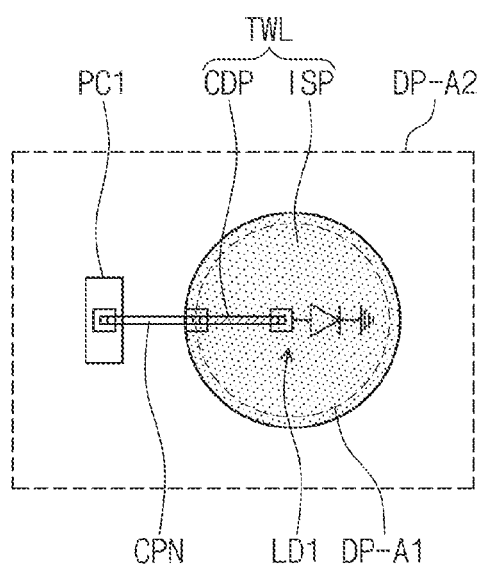
Figure 8B:
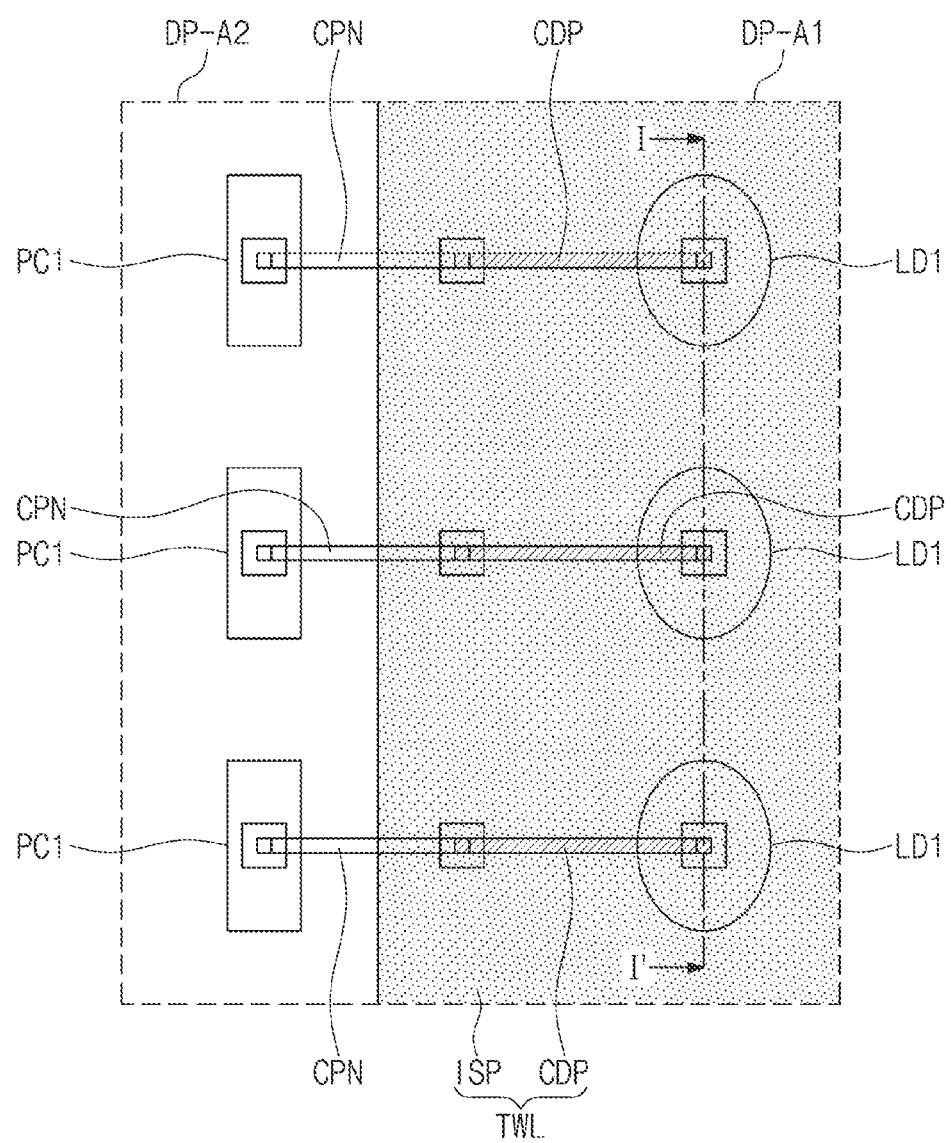
Figure 8C:
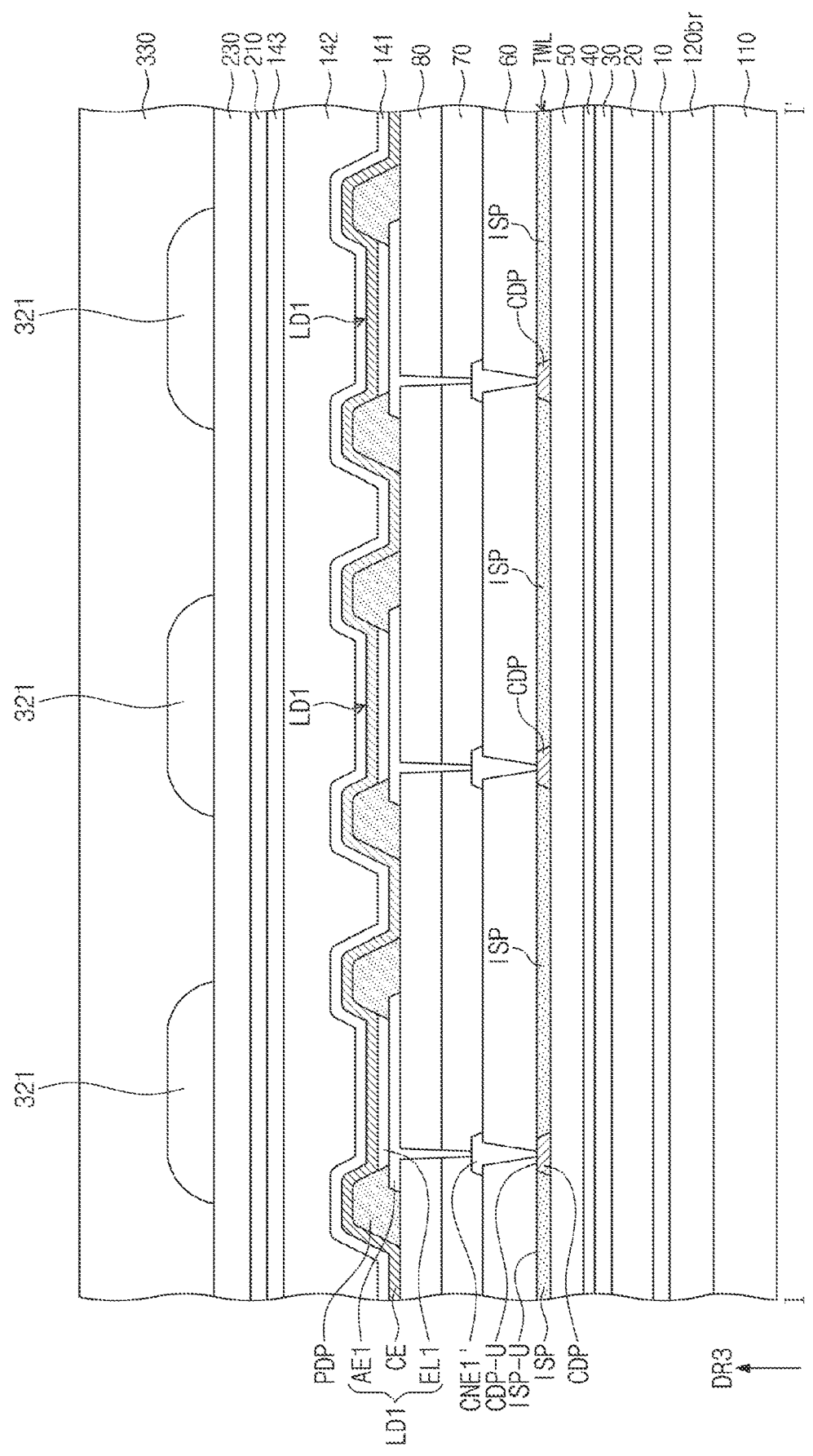
Figure 9:
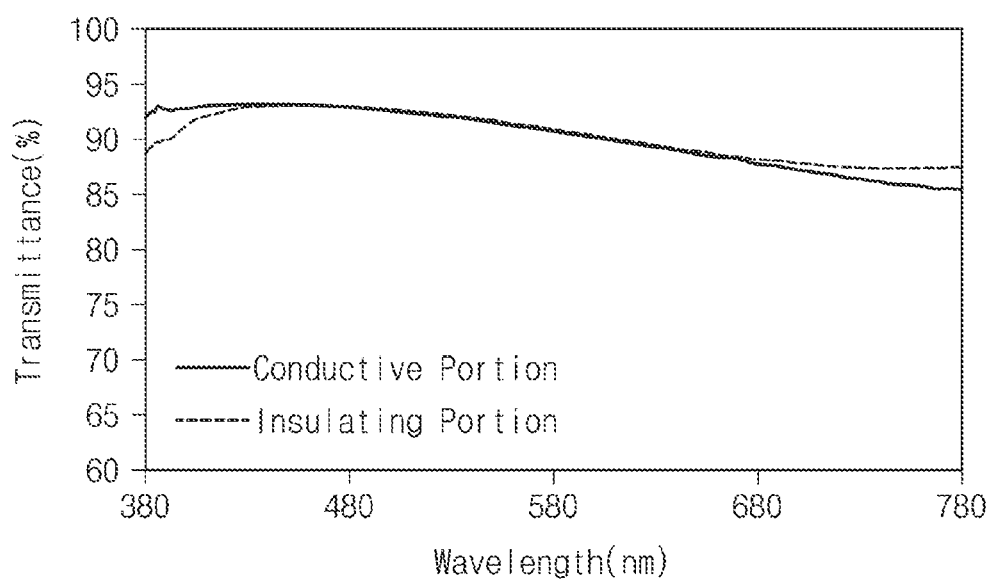
Figure 10A:
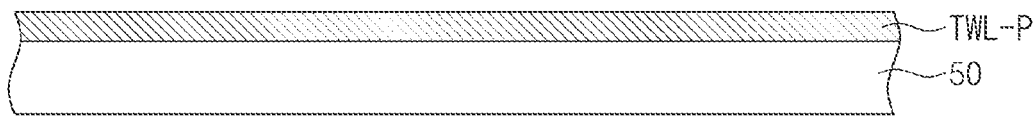
Figure 10B:
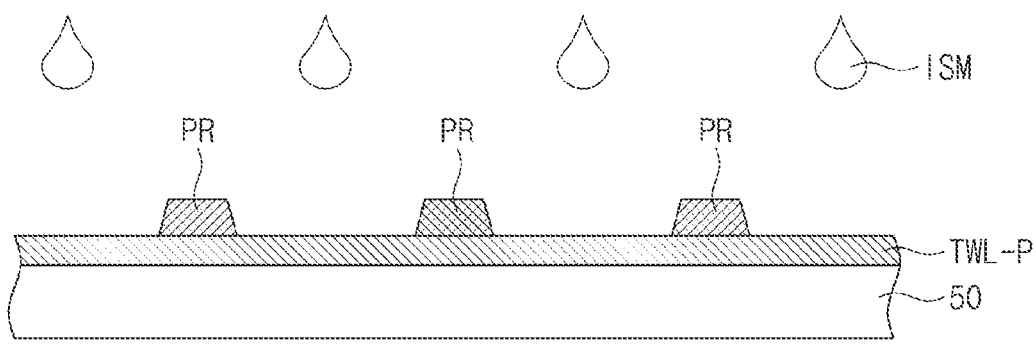
Figure 10C:
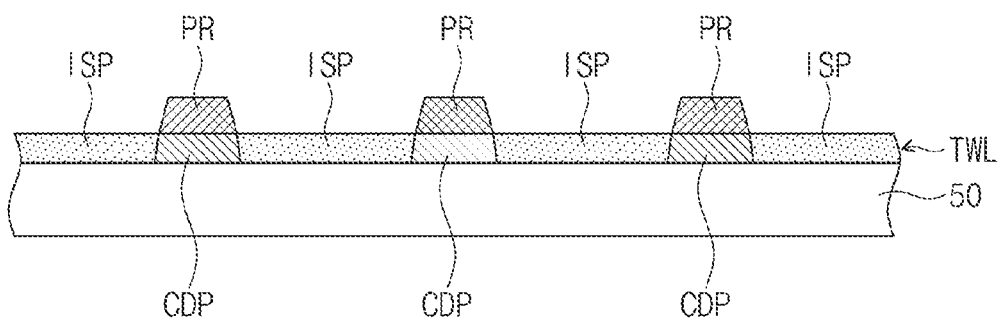
Figure 10D:
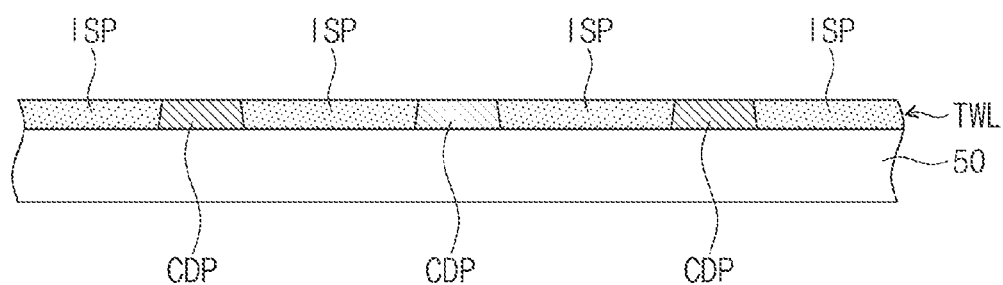
Figure 10E:
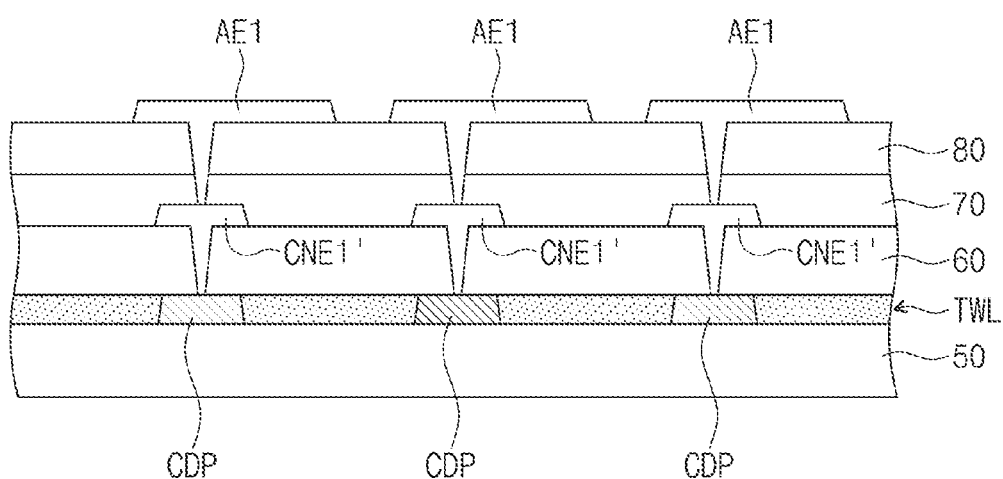

Each of FIGS. 7A and 7B is a cross-sectional view of a display device according to an embodiment of the inventive concept;

Each of FIGS. 8A and 8B is a plan view illustrating a portion of the display device according to an embodiment of the inventive concept;

FIG. 8C is a cross-sectional view of a portion of the display device according to an embodiment of the inventive concept;

FIG. 9 is a graph showing transmittances for each wavelength of a conductive portion and an insulating portion included in a wiring layer according to an embodiment of the inventive concept; and FIGS. 10A, 10B, 10C, 10D and 10E are cross-sectional views illustrating some steps of fabricating the display device according to an embodiment of the inventive concept.

DETAILED DESCRIPTION

In this specification, it will be understood that when an element (or region, layer, part, etc.) is referred to as being "on", "connected to" or "coupled to" another element, it can be directly on, connected or coupled to the other element, or intervening elements may be present.

Like reference numerals refer to like elements throughout. In addition, in the drawings, the thicknesses, ratios, and dimensions of elements are exaggerated for effective description of the technical contents. As used herein, the term "and/or" includes any and all combinations that the associated configurations can define.

It will be understood that, although the terms first, second, etc. may be used herein to describe various elements, these elements should not be limited by these terms. These terms are only used to distinguish one element from another element. For example, a first element could be termed a second element without departing from the scope of the present inventive concept. Similarly, the second element may also be referred to as the first element. The terms of a singular form include plural forms unless otherwise specified.

In addition, terms, such as "below", "lower", "above", "upper" and the like, are used herein for ease of description to describe one element's relation to another element(s) as illustrated in the figures. The above terms are relative concepts and are described based on the directions indicated in the drawings.

It will be understood that the terms "include" and/or "have", when used in this specification, specify the presence of stated features, integers, steps, operations, elements, components and/or groups thereof, but do not preclude the presence or addition of one or more other features, integers, steps, operations, elements, components, and/or groups thereof.

In this specification, the expression "being directly disposed" may mean that there is no layer, film, region, plate, or the like which is added between a part of a layer, film, region, plate, or the like and another part. For example, "being directly disposed" may mean that two layers or two members are disposed without an additional member such as an adhesive member interposed therebetween.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described with reference to the accompanying drawings.

Figure 1:
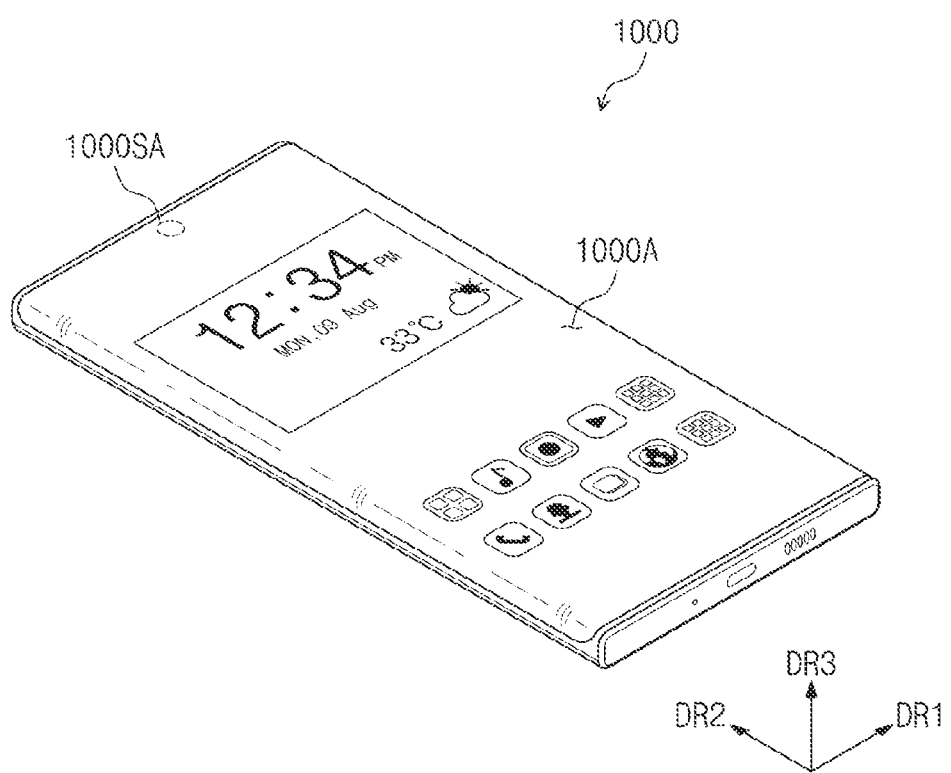
FIG. 1 is a perspective view of an electronic device according to an embodiment of the inventive concept.

FIG. 1 is a perspective view of an electronic device according to an embodiment of the inventive concept.

Referring to FIG. 1, the electronic device 1000 may be activated in response to an electrical signal. For example, the electronic device 1000 may be a mobile phone, a tablet, a monitor, a television, a car navigation system, a game machine, or a wearable device, but the embodiment of the inventive concept is not limited thereto. FIG. 1 illustrates that the electronic device 1000 is a mobile phone.

The electronic device 1000 may display an image through a display region 1000A. The display region 1000A may include a flat surface defined by a first direction DR1 and a second direction DR2. The display region 1000A may further include curved surfaces respectively bent from at least two sides of the flat surface. However, the shape of the display region 1000A is not limited thereto. For example, the display region 1000A may include only the flat surface and the display region 1000A may further include at least two or more, for example, four curved surfaces respectively bent from four sides of the flat surface.

A sensing region 1000SA may be defined in the display region 1000A of the electronic device 1000. Although one sensing region 1000SA is exemplarily illustrated in FIG. 1, the number of sensing regions 1000SA is not limited thereto. The sensing region 1000SA may be a portion of the display region 1000A. Accordingly, the electronic device 1000 may display an image through the sensing region 1000SA. The sensing region 1000SA may have a higher optical signal transmittance than the other region of the display region 1000A.

An electronic module may be disposed in a region overlapping the sensing region 1000SA of the electronic device 1000. The electronic module may receive an external input transmitted through the sensing region 1000SA or provide an output through the sensing region 1000SA. For example, the electronic module may be a camera module, a sensor configured to measure a distance, such as a proximity sensor, a sensor configured to recognize a part of a user's body (e.g., fingerprint, iris, or face), or a small lamp configured to output light, but the embodiment of the inventive concept is not particularly limited thereto.

The thickness direction of the electronic device 1000 may be parallel to a third direction DR3 crossing the first direction DR1 and the second direction DR2. Accordingly, the front surface (or upper surface) and rear surface (or lower surface) of members constituting the electronic device 1000 may be defined based on the third direction DR3.

Figure 2:
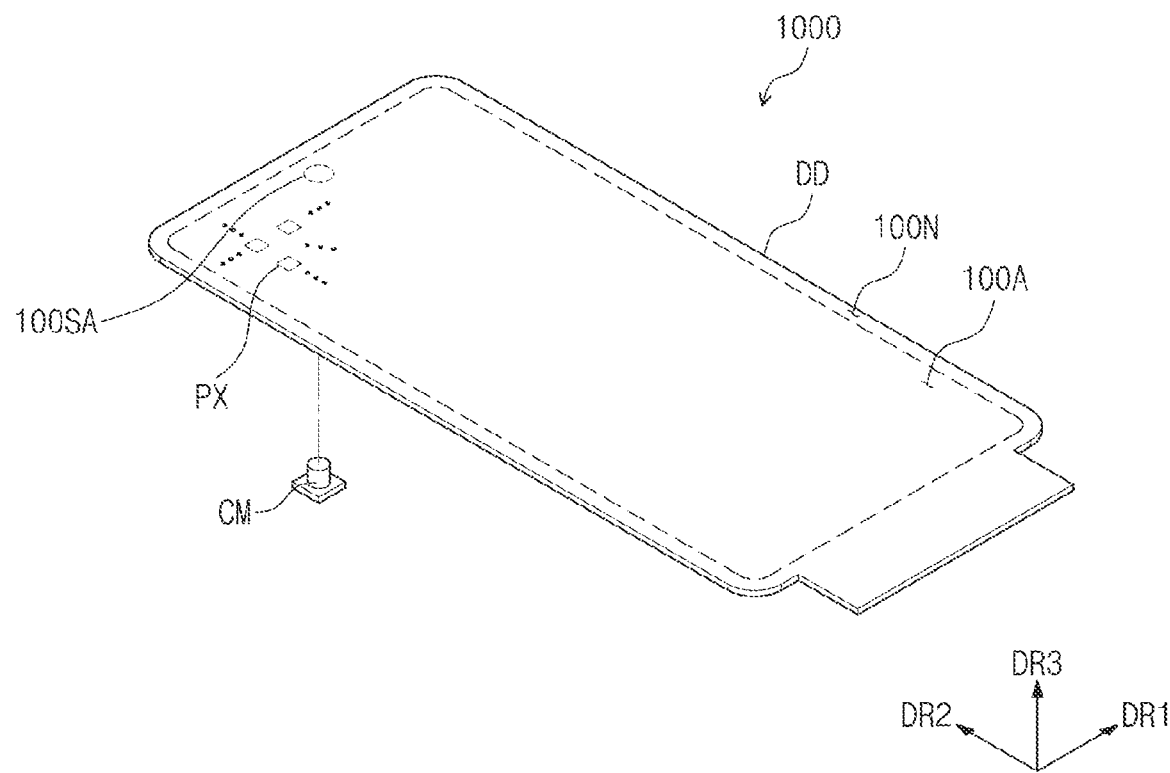
FIG. 2 is an exploded perspective view illustrating some components of the electronic device according to an embodiment of the inventive concept.

FIG. 2 is an exploded perspective view illustrating some components of the electronic device according to an embodiment of the inventive concept.

Referring to FIG. 2, the electronic device 1000 may include a display device DD and an electronic module CM. The display device DD may be configured to generate an image and sense an externally applied input signal. The electronic module CM may be disposed under the display device DD, and may be, for example, a camera module or an infrared sensor module. When the display device DD is defined as a first electronic module constituting the electronic device 1000, the electronic module CM may be defined as a second electronic module.

The display device DD may have a display region 100A and a peripheral region 100N defined therein. The display region 100A may correspond to the display region 1000A illustrated in FIG. 1. A partial region of the display device DD may be defined as a sensing region 100SA and the sensing region 100SA may have a higher transmittance than the other region (hereinafter, referred to as a main display region) of the display region 100A. The sensing region 100SA may be a portion of the display region 100A. That is, the sensing region 100SA may display an image and transmit an external input provided to the electronic module CM and/or an output from the electronic module CM. For example, when the electronic module CM is a camera module, the sensing region 100SA may provide external natural light to the electronic module CM.

A pixel PX is disposed in the display region 100A. A light-emitting element is disposed in the display region 100A and a light-emitting element is not disposed in the peripheral region 100N. A pixel PX is disposed in the sensing region 100SA and the main display region, respectively. However, the configuration of the pixel PX disposed in the sensing region 100SA may be different from that of the pixel PX disposed in the main display region. A detailed description thereof will be given later.

Figure 3:
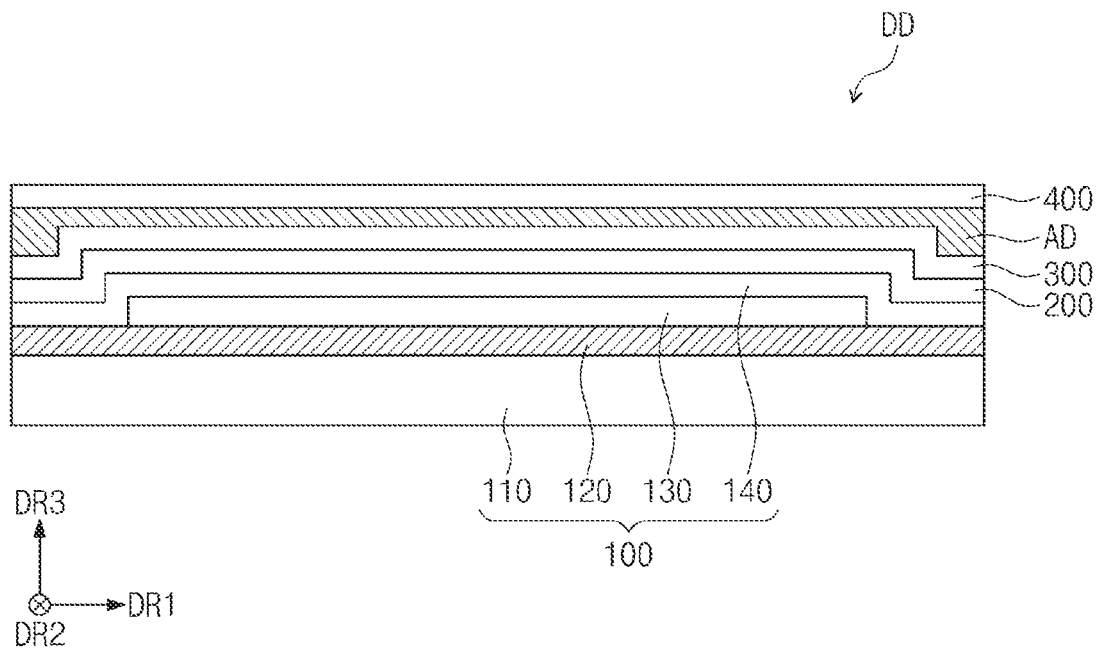
FIG. 3 is a cross-sectional view of a display device according to an embodiment of the inventive concept.

FIG. 3 is a cross-sectional view of a display device according to an embodiment of the inventive concept.

Referring to FIG. 3, the display device DD may include a display panel 100, a sensor layer 200, an anti-reflection layer 300, and a window 400. The anti-reflection layer 300 and the window 400 may be coupled to each other by an adhesive layer AD.

The display panel 100 may be configured to substantially generate an image. The display panel 100 may be a light-emitting display panel and, for example, the display panel 100 may be an organic light-emitting display panel, an inorganic light-emitting display panel, a quantum dot display panel, a micro LED display panel, or a nano LED display panel. The display panel 100 may also be referred to as a display layer.

The display panel 100 may include a base layer 110, a circuit layer 120, a light-emitting element layer 130, and an encapsulation layer 140.

The base layer 110 may be a substrate that provides a base surface on which the circuit layer 120 is disposed. The base layer 110 may be a rigid substrate or a flexible substrate capable of being bent, folded, rolled, or the like. The base layer 110 may be a glass substrate, a metal substrate, or a polymer substrate. However, the embodiment of the inventive concept is not limited thereto, and the base layer 110 may be an inorganic layer, an organic layer, or a composite material layer.

The base layer 110 may have a multi-layered structure. For example, the base layer 110 may include a first synthetic resin layer, a multi-layered or single-layered inorganic layer, and a second synthetic resin layer disposed on the multi-layered or single-layered inorganic layer. The base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer. Each of the first and second synthetic resin layers may contain a polyimide-based resin. In addition, each of the first and second synthetic resin layers may contain at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. Meanwhile, in this specification, a "~~"-based resin means that the resin includes a functional group of "~~".

The circuit layer 120 may be disposed on the base layer 110. The circuit layer 120 may include an insulating layer, a semiconductor pattern, a conductive pattern, a signal line, and the like. An insulating layer, a semiconductor layer, and a conductive layer may be formed above the base layer 110 by coating, deposition, etc., and then, the insulating layer, the semiconductor layer, and the conductive layer may be patterned through a plurality of photolithography processes. Thereafter, the semiconductor pattern, the conductive pattern, and the signal line included in the circuit layer 120 may be formed.

The light-emitting element layer 130 may be disposed on the circuit layer 120. The light-emitting element layer 130 may include a light-emitting element. For example, the light-emitting element may contain an organic light-emitting material, an inorganic light-emitting material, an organic-inorganic light-emitting material, a quantum dot, a quantum rod, a micro LED, or a nano LED.

The encapsulation layer 140 may be disposed on the light-emitting element layer 130. The encapsulation layer 140 may protect the light-emitting element layer 130 from foreign substances such as moisture, oxygen, and dust particles. The encapsulation layer 140 may include at least one inorganic layer. The encapsulation layer 140 may include a stack structure of an inorganic layer/an organic layer/an inorganic layer.

The sensor layer 200 may be disposed on the display panel 100. The sensor layer 200 may sense an external input applied from the outside. The external input may be a user's input. The user's input may include various types of external inputs, such as a part of the user's body, light, heat, a pen, or pressure.

The sensor layer 200 may be formed on the display panel 100 through a continuous process. In this case, the sensor layer 200 may be disposed directly on the display panel 100. Here, the expression that the sensor layer 200 is "disposed directly" on the display panel 100 may mean that a third component is not disposed between the sensor layer 200 and the display panel 100. That is, a separate adhesive may not be disposed between the sensor layer 200 and the display panel 100. Alternatively, the sensor layer 200 may be coupled to the display panel 100 by an adhesive. The adhesive may include a conventional adhesive or a glue agent.

The anti-reflection layer 300 may be disposed directly on the sensor layer 200. The anti-reflection layer 300 may reduce the reflectance of external light incident from the outside of the display device DD onto the display device DD. The anti-reflection layer 300 may be formed on the sensor layer 200 through a continuous process. The anti-reflection layer 300 may include color filters. The color filters may have a predetermined arrangement. For example, the color filters may be arranged in consideration of the light-emitting colors of pixels included in the display panel 100. In addition, the anti-reflection layer 300 may further include a black matrix disposed adjacent to the color filters. A detailed description of the anti-reflection layer 300 will be given later.

Alternatively, the anti-reflection layer 300 according to an embodiment of the inventive concept may include a retarder and a polarizer. The retarder may be a film type or a liquid crystal coating type and include a λ/2 retarder and/or a λ/4 retarder. The polarizer may also be a film type or a liquid crystal coating type. The film type may include a stretched synthetic resin film, and the liquid crystal coating type may include liquid crystals arranged in a predetermined arrangement. The retarder and the polarizer may be provided as one polarizing film. The anti-reflection layer 300 may further include a protective film disposed above or below the polarizing film.

In an embodiment of the inventive concept, the sensor layer 200 may be omitted. In this case, the anti-reflection layer 300 may be disposed directly on the display panel 100. In an embodiment of the inventive concept, the positions of the sensor layer 200 and the anti-reflection layer 300 may be interchanged with each other.

In an embodiment of the inventive concept, the positions of the sensor layer 200 and the anti-reflection layer 300 may be different from each other. For example, the anti-reflection layer 300 may be disposed between the display panel 100 and the sensor layer 200.

Although not illustrated, in an embodiment of the inventive concept, the display device DD may further include an optical layer disposed on the anti-reflection layer 300. For example, the optical layer may be formed on the anti-reflection layer 300 through a continuous process. The optical layer may control the direction of light incident from the display panel 100 to improve the front luminance of the display device DD. For example, the optical layer may include: an organic insulating layer in which openings are defined to correspond respectively to light-emitting regions of pixels included in the display panel 100; and a high refraction layer covering the organic insulating layer and filling the openings. The high refraction layer may have a higher refractive index than the organic insulating layer.

The window 400 may provide on the front surface of the electronic device 1000. The window 400 may include a glass film or a synthetic resin film as a base film. The window 400 may further include an anti-reflection layer or an anti-fingerprint layer. The window 400 may include a glass film or a synthetic resin film. The window 400 may further include a bezel pattern overlapping the peripheral region DP-NA of the display panel 100.

Figure 4:
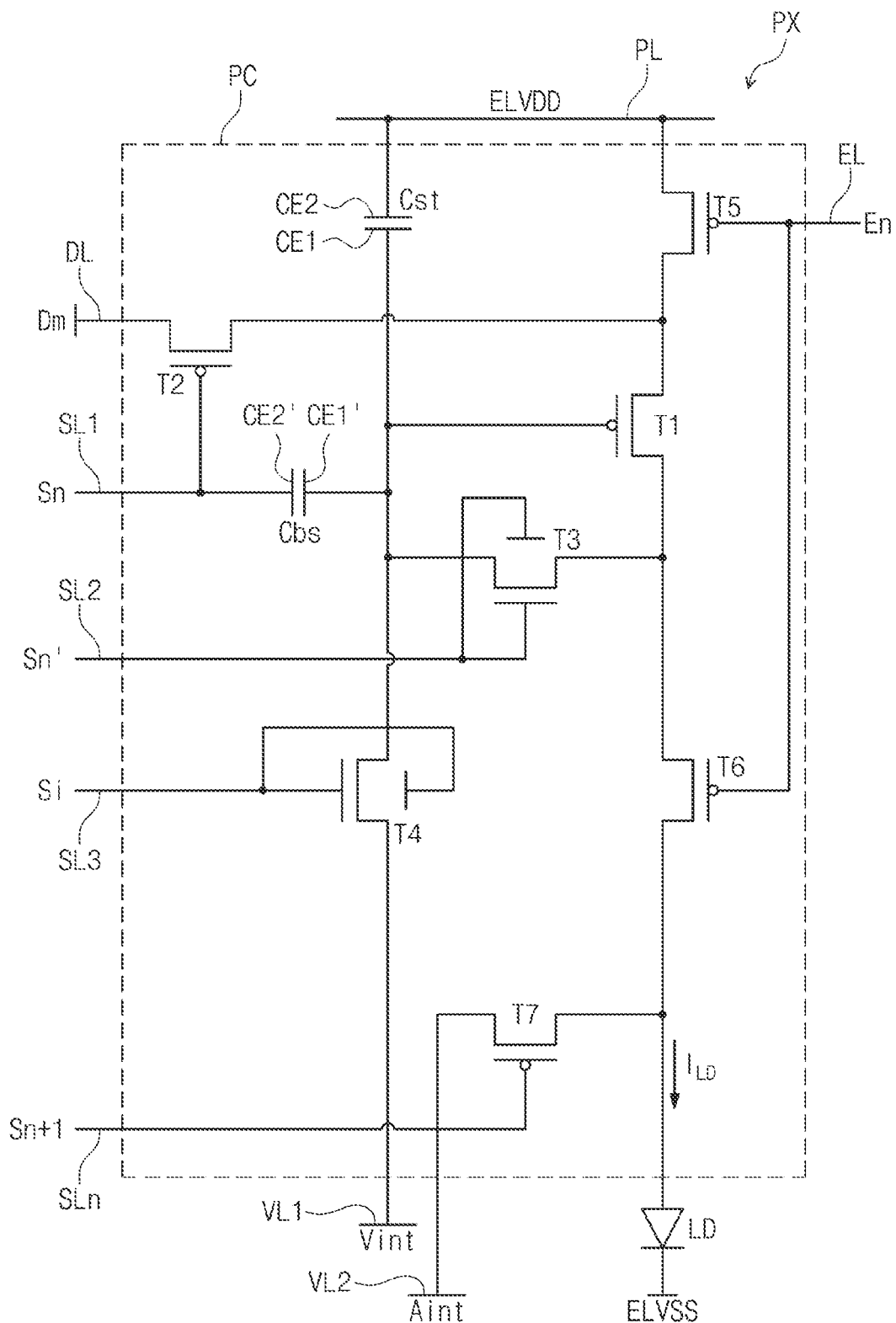
FIG. 4 is an equivalent circuit diagram of a pixel according to an embodiment of the inventive concept.

FIG. 4 is an equivalent circuit diagram of a pixel according to an embodiment of the inventive concept.

Referring to FIG. 4, an equivalent circuit diagram of one pixel PX among a plurality of pixels PX is illustrated. The pixel PX illustrated in FIG. 4 may be a first pixel PX1 (refer to FIG. 5), a second pixel PX2 (refer to FIG. 5), or a third pixel PX3 (refer to FIG. 5). The pixel PX may include a light-emitting element LD and a pixel circuit PC. The light-emitting element LD may be a component included in the light-emitting element layer 130 of FIG. 3, and the pixel circuit PC may be a component included in the circuit layer 120 of FIG. 3.

The pixel circuit PC may include a plurality of thin film transistors T1, T2, T3, T4, T5, T6, and T7 and a storage capacitor Cst. The plurality of thin film transistors T1, T2, T3, T4, T5, T6, and T7 and the storage capacitor Cst may be electrically connected to signal lines SL1, SL2, SL3, SLn, EL, and DL, a first initialization voltage line VL1, a second initialization voltage line VL2 (or anode initialization voltage line), and a driving voltage line PL. In an embodiment of the inventive concept, at least one of the above-described lines, for example, the driving voltage line PL may be shared by neighboring pixels PX.

The plurality of thin film transistors T1, T2, T3, T4, T5, T6, and T7 may include a driving thin film transistor T1, a switching thin film transistor T2, a compensation thin film transistor T3, a first initialization thin film transistor T4, an operation control thin film transistor T5, a light-emitting control thin film transistor T6, and a second initialization thin film transistor T7.

The light-emitting element LD may include a lower electrode (e.g., an anode electrode or a pixel electrode) and an upper electrode (e.g., a cathode electrode or a common electrode), the lower electrode of the light emitting element LD may be connected to the driving thin film transistor T1 via the light-emitting control thin film transistor T6 so as to receive a driving current ILD, and the upper electrode may receive a low power supply voltage ELVSS. The light-emitting element LD may generate light having a luminance corresponding to the driving current ILD.

Some of the plurality of thin film transistors T1, T2, T3, T4, T5, T6, and T7 may be provided as an n-channel MOSFET (NMOS) and others thereof may be provided as a p-channel MOSFET (PMOS). For example, among the plurality of thin film transistors T1, T2, T3, T4, T5, T6, and T7, the compensation thin film transistor T3 and the first initialization thin film transistor T4 may be provided as an n-channel MOSFET (NMOS) and the remainder may be provided as a p-channel MOSFET (PMOS).

In another embodiment of the inventive concept, among the plurality of thin film transistors T1, T2, T3, T4, T5, T6, and T7, the compensation thin film transistor T3, the first initialization thin film transistor T4, and the second initialization thin film transistor T7 may be provided as an NMOS, and the remainder may be provided as a PMOS. Alternatively, only one of the plurality of thin film transistors T1, T2, T3, T4, T5, T6, and T7 may be provided as an NMOS and the remainder may be provided as a PMOS. Alternatively, all of the plurality of thin film transistors T1, T2, T3, T4, T5, T6, and T7 may be provided as an NMOS or a PMOS.

The signal line may include a first scan line SL1 configured to transmit a first scan signal Sn, a second scan line SL2 configured to transmit a second scan signal Sn', a third scan line SL3 configured to transmit a third scan signal Si to the first initialization thin film transistor T4, a light-emitting control line EL configured to transmit a light-emitting control signal En to the operation control thin film transistor T5 and the light-emitting control thin film transistor T6, a next scan line SLn configured to transmit a next scan signal Sn+1 to the second initialization thin film transistor T7, and a data line DL which crosses the first scan line SL1 and transmits a data signal Dm. The first scan signal Sn may be a current scan signal, and the next scan signal Sn+1 may be a scan signal which comes after the first scan signal Sn.

The driving voltage line PL may transmit a driving voltage ELVDD to the driving thin film transistor T1, the first initialization voltage line VL1 may transmit an initialization voltage Vint which initializes the driving thin film transistor T1, and the second initialization voltage line VL2 may transmit an anode initialization voltage Aint which initializes the pixel electrode.

The driving gate electrode of the driving thin film transistor T1 may be connected to a first electrode CE1 of the storage capacitor Cst, the driving source region of the driving thin film transistor T1 may be connected to the driving voltage line PL via the operation control thin film transistor T5, and the driving drain region of the driving thin film transistor T1 may be electrically connected to the first electrode of the light-emitting element LD via the light-emitting control thin film transistor T6. The driving thin film transistor T1 may receive the data signal Dm in response to the switching operation of the switching thin film transistor T2 and provide the driving current ILD to the light-emitting element LD.

The switching gate electrode of the switching thin film transistor T2 may be connected to the first scan line SL1 configured to transmit the first scan signal Sn, the switching source region of the switching thin film transistor T2 may be connected to the data line DL, and the switching drain region of the switching thin film transistor T2 may be connected to the driving source region of the driving thin film transistor T1 and may also be connected to the driving voltage line PL via the operation control thin film transistor T5. The switching thin film transistor T2 may be turned on in response to the first scan signal Sn transmitted through the first scan line SL1 so as to perform a switching operation which transmits the data signal Dm transmitted through the data line DL to the driving source region of the driving thin film transistor T1.

The compensation gate electrode of the compensation thin film transistor T3 is connected to the second scan line SL2. The compensation drain region of the compensation thin film transistor T3 may be connected to the driving drain region of the driving thin film transistor T1 and may also be connected to the pixel electrode of the light-emitting element LD via the light-emitting control thin film transistor T6. The compensation source region of the compensation thin film transistor T3 may be connected to the first electrode CE1 of the storage capacitor Cst and the driving gate electrode of the driving thin film transistor T1. In addition, the compensation source region may be connected to a first initialization drain region of the first initialization thin film transistor T4.

The compensation thin film transistor T3 may be turned on in response to the second scan signal Sn' received through the second scan line SL2 so as to electrically connect the driving gate electrode and the driving drain region of the driving thin film transistor T1 to diode-connect the driving thin film transistor T1.

A first initialization gate electrode of the first initialization thin film transistor T4 may be connected to the third scan line SL3. A first initialization source region of the first initialization thin film transistor T4 may be connected to the first initialization voltage line VL1. The first initialization drain region of the first initialization thin film transistor T4 may be connected to the first electrode CE1 of the storage capacitor Cst, the compensation source region of the compensation thin film transistor T3, and the driving gate electrode of the driving thin film transistor T1. The first initialization thin film transistor T4 may be turned on in response to the third scan signal Si received through the third scan line SL3 so as to provide the initialization voltage Vint to the driving gate electrode of the driving thin film transistor T1, thus being able to perform an initialization operation for initializing the voltage of the driving gate electrode of the driving thin film transistor T1.

The operation control gate electrode of the operation control thin film transistor T5 may be connected to the light-emitting control line EL, the operation control source region of the operation control thin film transistor T5 may be connected to the driving voltage line PL, and the operation control drain region of the operation control thin film transistor T5 may be connected to the driving source region of the driving thin film transistor T1 and the switching drain region of the switching thin film transistor T2.

The light-emitting control gate electrode of the light-emitting control thin film transistor T6 may be connected to the light-emitting control line EL, the light-emitting control source region of the light-emitting control thin film transistor T6 may be connected to the driving drain region of the driving thin film transistor T1 and the compensation drain region of the compensation thin film transistor T3, and the light-emitting control drain region of the light-emitting control thin film transistor T6 may be electrically connected to the second initialization drain region of the second initialization thin film transistor T7 and the pixel electrode of the light-emitting element LD.

The operation control thin film transistor T5 and the light-emitting control thin film transistor T6 are simultaneously turned on in response to the light-emitting control signal En received through the light-emitting control line EL so as to provide the driving voltage ELVDD to the light-emitting element LD, thus allowing the driving current ILD to flow through the light-emitting element LD.

The second initialization gate electrode of the second initialization thin film transistor T7 may be connected to the next scan line SLn, the second initialization drain region of the second initialization thin film transistor T7 may be connected to the light-emitting control drain region of the light-emitting control thin film transistor T6 and the pixel electrode of the light-emitting element LD, and the second initialization source region of the second initialization thin film transistor T7 may be connected to the second initialization voltage line VL2 so as to receive an anode initialization voltage Aint. The second initialization thin film transistor T7 is turned on in response to the next scan signal Sn+1 received through the next scan line SLn so as to initialize the pixel electrode of the light-emitting element LD.

In another embodiment of the inventive concept, the second initialization thin film transistor T7 may be connected to the light-emitting control line EL and be driven in response to the light-emitting control signal En. Meanwhile, the positions of the source regions and the drain regions may be interchanged with each other according to the types (p-type or n-type) of transistors.

The storage capacitor Cst may include a first electrode CE1 and a second electrode CE2. The first electrode CE1 of the storage capacitor Cst is connected to the driving gate electrode of the driving thin film transistor T1, and the second electrode CE2 of the storage capacitor Cst is connected to the driving voltage line PL. The storage capacitor Cst may store a charge corresponding to a difference between the driving gate electrode voltage of the driving thin film transistor T1 and the driving voltage ELVDD.

The boosting capacitor Cbs may include a first electrode CE1' and a second electrode CE2'. The first electrode CE1' of the boosting capacitor Cbs may be connected to the first electrode CE1 of the storage capacitor Cst, and the second electrode CE2' of the boosting capacitor Cbs may receive the first scan signal Sn. The boosting capacitor Cbs may compensate for the voltage drop of the gate terminal of the driving thin film transistor T1 by increasing the voltage of the gate terminal when the supply of the first scan signal Sn is stopped.

A detailed operation of each pixel PX according to an embodiment of the inventive concept is as follows.

During an initialization period, when the third scan signal Si is provided through the third scan line SL3, the first initialization thin film transistor T4 is turned on in response to the third scan signal Si, and the driving thin film transistor T1 is initialized by the initialization voltage Vint supplied from the first initialization voltage line VL1.

During a data programming period, when the first scan signal Sn and the second scan signal Sn' are provided through the first scan line SL1 and the second scan line SL2, the switching thin film transistor T2 and the compensation thin film transistor T3 are turned on in response to the first scan signal Sn and the second scan signal Sn'. In this case, the driving thin film transistor T1 is diode-connected by the turned-on compensation thin film transistor T3 and is biased in a forward direction.

Then, in the data signal Dm provided from the data line DL, a compensation voltage Dm+Vth (Vth is a negative value) reduced by a threshold voltage Vth of the driving thin film transistor T1 is applied to the driving gate electrode of the driving thin film transistor T1.

The driving voltage ELVDD and the compensation voltage Dm+Vth are applied to both ends of the storage capacitor Cst, and a charge corresponding to a voltage difference between the both ends thereof is stored in the storage capacitor Cst.

During a light-emitting period, the operation control thin film transistor T5 and the light-emitting control thin film transistor T6 are turned on by the light-emitting control signal En provided from the light-emitting control line EL. A driving current ILD is generated according to a voltage difference between the voltage of the driving gate electrode of the driving thin film transistor T1 and the driving voltage ELVDD, and the driving current ILD is supplied to the light-emitting element LD through the light-emitting control thin film transistor T6.

In this embodiment, at least one of the plurality of thin film transistors T1, T2, T3, T4, T5, T6, and T7 includes a semiconductor layer which contains oxide, and the remainder includes a semiconductor layer which contains silicon.

Specifically, the driving thin film transistor T1, which directly affects the brightness of the display device, is configured to include a semiconductor layer made of polycrystalline silicon having high reliability, thereby being able to achieve a high-resolution display device.

Meanwhile, since an oxide semiconductor has a high carrier mobility and a low leakage current, a voltage drop is not large although driving time is long. That is, since a color change of an image due to the voltage drop is not great even during low-frequency driving, the low-frequency driving is possible.

As described above, since the oxide semiconductor has an advantage of a small leakage current, at least one of the compensation thin film transistor T3 connected to the driving gate electrode of the driving thin film transistor T1, the first initialization thin film transistor T4, or the second initialization thin film transistor T7 may be an oxide semiconductor in order to prevent a leakage current from flowing to the driving gate electrode and reduce power consumption as well.

Figure 5:
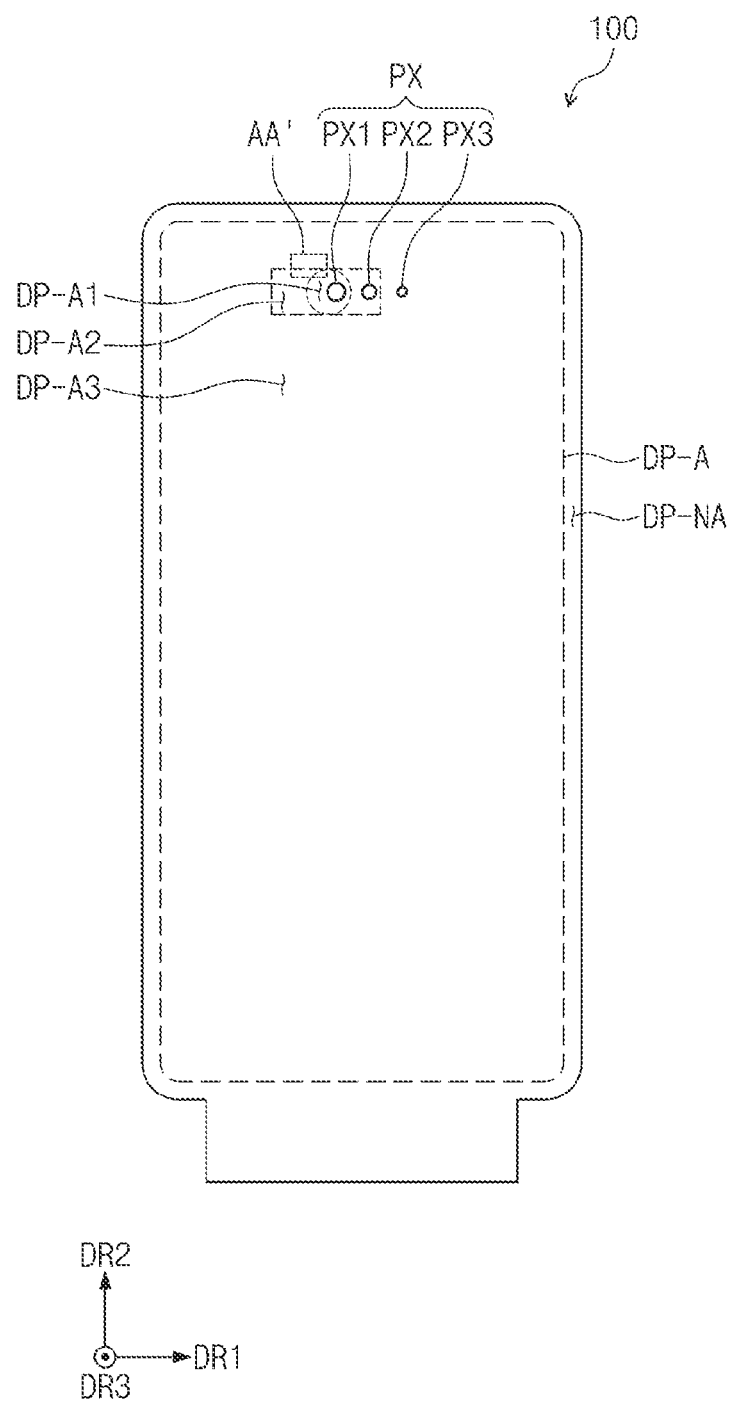
FIG. 5 is a plan view of a display panel according to an embodiment of the inventive concept.
Figure 6:
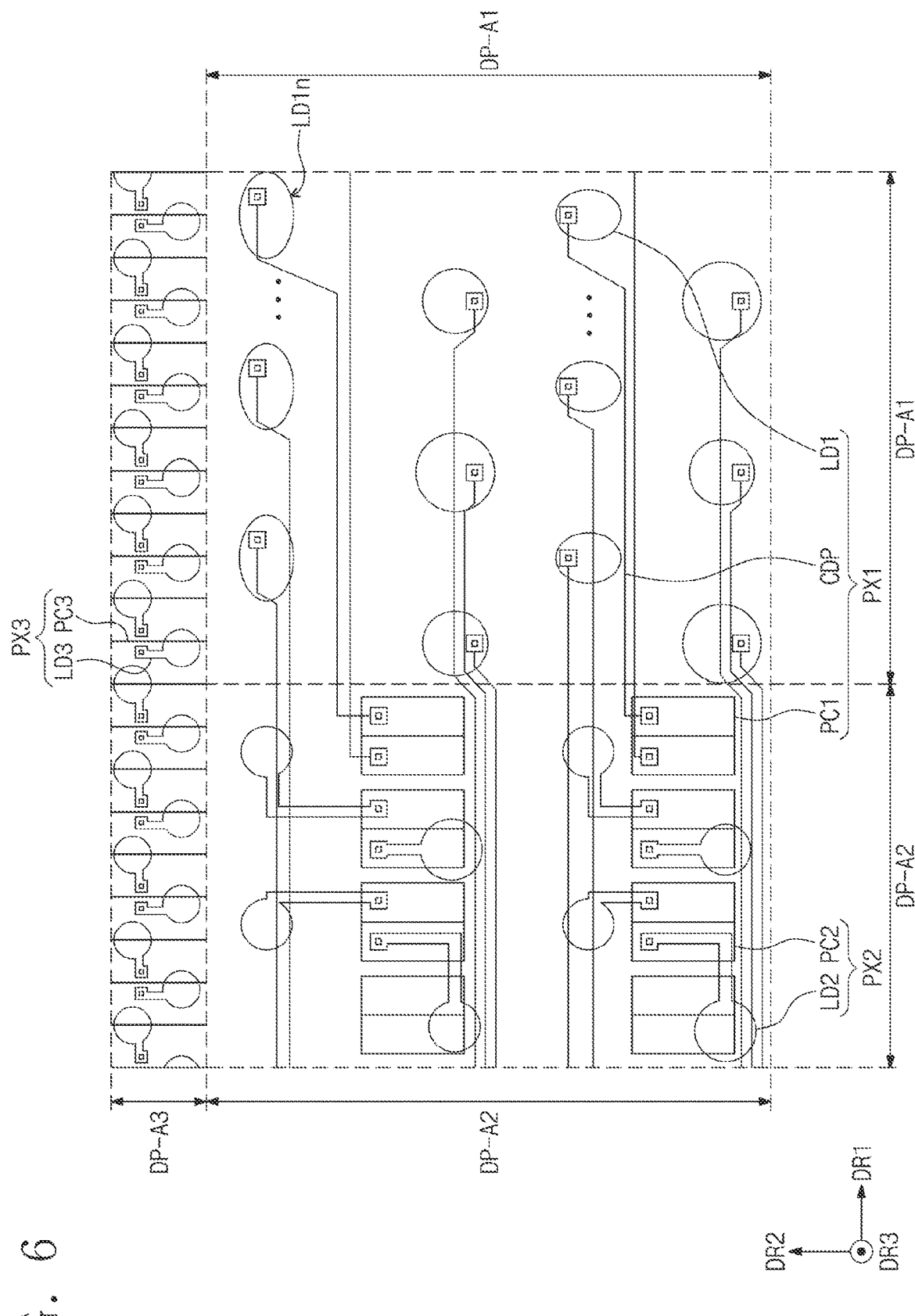
FIG. 6 is an enlarged plan view of a portion of the display panel according to an embodiment of the inventive concept.

FIG. 5 is a plan view of a display panel according to an embodiment of the inventive concept. FIG. 6 is an enlarged plan view of a portion of the display panel according to an embodiment of the inventive concept. FIG. 6 is an enlarged plan view illustrating region AA' of FIG. 5.

Referring to FIGS. 5 and 6, the display panel 100 may include a display region DP-A and a peripheral region DP-NA. The peripheral region DP-NA may be disposed adjacent to the display region DP-A and surround at least a portion of the display region DP-A.

The display region DP-A may include a first region DP-A1, a second region DP-A2, and a third region DP-A3. The first region DP-A1 may be referred to as a component region, the second region DP-A2 may be referred to as an intermediate region or a transition region, and the third region DP-A3 may be referred to as a main display region or a general display region. The first region DP-A1 and the second region DP-A2 may be referred to as an auxiliary display region.

The display panel 100 may include a plurality of pixels PX. The plurality of pixels PX may include a first pixel PX1 configured to emit light in the first region DP-A1, a second pixel PX2 configured to emit light in the second region DP-A2, and a third pixel PX3 configured to emit light in the third region DP-A3.

Each of the first pixel PX1, the second pixel PX2, and the third pixel PX3 may be provided in plurality. In this case, each of the first to third pixels PX1, PX2, and PX3 may include a red pixel, a green pixel, and a blue pixel, and further include a white pixel.

The first pixel PX1 may include a first light-emitting element LD1 and a first pixel circuit PC1 configured to drive the first light-emitting element LD1, the second pixel PX2 may include a second light-emitting element LD2 and a second pixel circuit PC2 configured to drive the second light-emitting element LD2, and the third pixel PX3 may include a third light-emitting element LD3 and a third pixel circuit PC3 configured to drive the third light-emitting element LD3. The positions of the first pixel PX1, the second pixel PX2, and the third pixel PX3 illustrated in FIG. 6 are illustrated to correspond to the positions of the first, second, and third light-emitting elements LD1, LD2, and LD3.

The first region DP-A1 may be a region correspond to the sensing region 1000SA illustrated in FIG. 1. That is, the first region DP-A1 may be provided in a region overlapping the electronic module CM, which is illustrated in FIG. 2, in a plan view. For example, an external input (e.g., light) may be provided to the electronic module CM via the first region DP-A1 and an output from the electronic module CM may be released to the outside through the first region DP-A1. In this embodiment, the first region DP-A1 is illustrated as a circular shape, but the shape of the first region DP-A1 may have various shapes such as a polygon, an oval, a figure having at least one curved side, or an atypical shape, and the present inventive concept is not limited to any one embodiment.

In order to secure the area of a transmission region, a smaller number of pixels may be provided in the first region DP-A1 than in the third region DP-A3. A region, in which the first light-emitting element LD1 is not disposed in the first region DP-A1, may be defined as a transmission region TA (refer to FIG. 7B). For example, a region, in which the first electrode of the first light-emitting element LD1 and a pixel defining pattern surrounding the first electrode are not disposed in the first region DP-A1, may be defined as the transmission region TA (refer to FIG. 7B).

The number of first pixels PX1 disposed in a unit area in the first region DP-A1 may be smaller than the number of third pixels PX3 disposed in the unit area in the third region DP-A3. For example, the resolution of the first region DP-A1 may be about ½, ⅜, ⅓, ¼, ⅖, ⅛, ⅑, or 1/16 of the resolution of the third region DP-A3. For example, the resolution of the third region DP-A3 may be about 400 ppi or more, and the resolution of the first region DP-A1 may be about 200 ppi or about 100 ppi. However, this is only an example and the embodiment of the inventive concept is not particularly limited thereto.

The first pixel circuit PC1 of the first pixel PX1 may not be disposed in the first region DP-A1. For example, the first pixel circuit PC1 may be disposed in the second region DP-A2 or the peripheral region DP-NA. In this case, the light transmittance of the first region DP-A1 may be increased more than a case when the first pixel circuit PC1 is disposed in the first region DP-A1.

The first light-emitting element LD1 and the first pixel circuit PC1 may be electrically connected to each other through a conductive portion CDP. The conductive portion CDP may overlap the transmission region of the first region DP-A1. The conductive portion CDP may contain a transparent conductive polymer material. The conductive portion CDP may contain a light-transmitting material. For example, the conductive portion CDP may contain at least one of polyethylenedioxythiophene (PEDOT), polythiophene, polyaniline, polypyrrole, or polyacetylene. The conductive portion CDP may contain polyethylenedioxythiophene:polystyrenesulfonate (PEDOT:PSS).

The conductive portion CDP corresponds to a portion of a wiring layer TWL (refer to FIG. 7B) to be described later. The conductive portion CDP may correspond to a portion connecting the first light-emitting element LD1 disposed in the first region DP-A1 and the first pixel circuit PC1 disposed in the second region DP-A2 or the peripheral region DP-NA in the wiring layer TWL (refer to FIG. 7B). The wiring layer TWL may be a single layer.

The second region DP-A2 is disposed adjacent to the first region DP-A1. The second region DP-A2 may surround at least a portion of the first region DP-A1. The second region DP-A2 may have a lower transmittance than the first region DP-A1. In this embodiment, the second region DP-A2 may be spaced apart from the peripheral region DP-NA. However, the embodiment of the inventive concept is not limited thereto, and the second region DP-A2 may be in contact with the peripheral region DP-NA.

The first pixel circuit PC1 of the first pixel PX1, the second light-emitting element LD2, and the second pixel circuit PC2 may be disposed in the second region DP-A2. Accordingly, the light transmittance of the second region DP-A2 may be lower than the light transmittance of the first region DP-A1. In addition, as the first pixel circuit PC1 of the first pixel PX1 is disposed in the second region DP-A2, the number of second pixels PX2 disposed in the second region DP-A2 may be smaller than the number of third pixels PX3 disposed in the third region DP-A3. The resolution of an image displayed in the second region DP-A2 may be lower than the resolution of an image displayed in the third region DP-A3.

The third region DP-A3 is disposed adjacent to the second region DP-A2. The third region DP-A3 may be disposed adjacent to the first region DP-A1. The third region DP-A3 may be defined as a region having a transmittance lower than that of the first region DP-A1. The third light-emitting element LD3 and the third pixel circuit PC3 may be disposed in the third region DP-A3.

In order to secure a distance between the third light-emitting element LD3 disposed in the third region DP-A3 and the first light-emitting element LD1n, a first light-emitting element LD1n disposed in the first region DP-A1 and disposed closest to the third region DP-A3 may have a circular shape having a larger width in a specific direction. For example, when the first region DP-A1 is disposed adjacent to the third region DP-A3 in the second direction DR2, the width of the first light-emitting element LD1n in the first direction DR1 may be greater than the width thereof in the second direction DR2.

Each of the first light-emitting element LD1, the second light-emitting element LD2, and the third light-emitting element LD3 may be provided in plurality. The distance between adjacent first light-emitting elements among the first light-emitting elements LD1 may be greater than the distance between adjacent third light-emitting elements among the third light-emitting elements LD3. In addition, the distance between adjacent second light-emitting elements among the second light emitting elements LD2 may be greater than the distance between adjacent third light-emitting elements among the third light-emitting elements LD3.

The first, second, and third light-emitting elements LD1, LD2, and LD3 illustrated in FIG. 6 may correspond to the planar shapes of a first electrode AE1 (refer to FIG. 7B) of the first light-emitting element LD1, a first electrode AE2 (refer to FIG. 7B) of the second light-emitting element LD2, and a first electrode AE3 (refer to FIG. 7A) of the third light-emitting element LD3. As illustrated in FIG. 6, the planar area of the first lower electrode AE1 (refer to FIG. 7B) may be greater than the planar area of the third lower electrode AE3 (refer to FIG. 7A).

FIGS. 7A and 7B are cross-sectional views of a display device according to an embodiment of the inventive concept. FIG. 7A is a cross-sectional view of a portion included in the third region DP-A3, and FIG. 7B is a cross-sectional view of a portion included in the first region DP-A1 and the second region DP-A2.

Referring to FIGS. 7A and 7B, the display panel 100 may include a plurality of insulating layers, a semiconductor pattern, a conductive pattern, a signal line, and the like. An insulating layer, a semiconductor layer, and a conductive layer are formed by coating, deposition, or the like. Thereafter, the insulating layer, the semiconductor layer, and the conductive layer may be patterned through a photolithography process. In this way, a semiconductor pattern, a conductive pattern, a signal line, and the like included in the circuit layer 120 and the light-emitting element layer 130 are formed. Thereafter, the encapsulation layer 140 covering the light-emitting element layer 130 may be formed.

FIG. 7A illustrates a silicon transistor S-TFT and an oxide transistor O-TFT of the third light-emitting element LD3 and the third pixel circuit PC3. FIG. 7B illustrates the first light-emitting element LD1 and the first pixel circuit PC1, and the second light-emitting element LD2 and the second pixel circuit PC2.

A buffer layer 120*br* may be disposed on the base layer 110. The buffer layer 120*br* may prevent metal atoms or impurities from diffusing from the base layer 110 into a first semiconductor pattern. In addition, the buffer layer 120*br* may adjust a heat transfer rate during a crystallization process for forming the first semiconductor pattern so that the first semiconductor pattern may be uniformly formed.

A first back surface metal layer BMLa may be disposed under the silicon transistor S-TFT, and a second back surface metal layer BMLb may be disposed under the oxide transistor O-TFT. The first and second back surface metal layers BMLa and BMLb may be disposed to overlap the first to third pixel circuits PC1, PC2, and PC3. The first and second back surface metal layers BMLa and BMLb may block external light from reaching the first to third pixel circuits PC1, PC2, and PC3. In addition, the first and second back surface metal layers BMLa and BMLb may block laser or the like for etching in a subsequent process from reaching the first to third pixel circuits PC1, PC2, and PC3. The first and second back surface metal layers BMLa and BMLb may not overlap the first region DP-A1.

The first back surface metal layer BMLa may be disposed between the base layer 110 and the buffer layer 120*br*. In an embodiment of the inventive concept, an inorganic barrier layer may be further disposed between the first back surface metal layer BMLa and the buffer layer 120*br*. The first back surface metal layer BMLa may be connected to an electrode or a wiring that provide a constant voltage or a signal.

According to an embodiment of the inventive concept, the first back surface metal layer BMLa may be a floating electrode isolated from other electrodes or wirings.

The second back surface metal layer BMLb may be disposed to correspond to the lower portion of the oxide transistor O-TFT. The second back surface metal layer BMLb may be disposed between a second insulating layer 20 and a third insulating layer 30. The second back surface metal layer BMLb may be disposed on the same layer as a layer on which the second electrode CE2 of the storage capacitor Cst is disposed. The second back surface metal layer BMLb may be connected to a contact electrode BML2-C so as to receive a constant voltage or a signal. The contact electrode BML2-C may be disposed on the same layer as a layer on which the gate GT2 of the oxide transistor O-TFT is disposed.

Each of the first back surface metal layer BMLa and the second back surface metal layer BMLb may contain a reflective metal. For example, each of the first back surface metal layer BMLa and the second back surface metal layer BMLb may contain silver (Ag), an alloy containing silver (Ag), molybdenum (Mo), an alloy containing molybdenum, aluminum (Al), an alloy containing aluminum, aluminum nitride (AlN), tungsten (W), tungsten nitride (WN), copper (Cu), p-doped amorphous silicon, and the like. The first back surface metal layer BMLa and the second back surface metal layer BMLb may contain a same material or different materials.

Although not illustrated separately, according to an embodiment of the inventive concept, the second back surface metal layer BMLb may be omitted. The first back surface metal layer BMLa may extend to a lower portion of the oxide transistor O-TFT so that the first back surface metal layer BMLa may block external light from being incident to the lower portion of the oxide transistor O-TFT.

A first semiconductor pattern SP1 may be disposed on the buffer layer 120*br*. The first semiconductor pattern may include a silicon semiconductor. For example, the silicon semiconductor may include amorphous silicon, polycrystalline silicon, or the like. For example, the first semiconductor pattern may include low-temperature polysilicon.

FIGS. 7A and 7B illustrate only a portion of the first semiconductor pattern SP1 disposed on the buffer layer 120*br*, and the first semiconductor pattern SP1 may be further disposed in another region. The first semiconductor pattern SP1 may be arranged in a specific configuration across the pixels. The first semiconductor pattern SP1 may have different electrical properties depending on a impurity doping level. The first semiconductor pattern SP1 may include a first region having high conductivity and a second region having low conductivity. The first region may be highly doped with an N-type dopant or a P-type dopant. A P-type transistor may include a doped region doped with a P-type dopant, and an N-type transistor may include a doped region doped with an N-type dopant. The second region may be a non-doped region or a lightly doped region having a lower impurity doping level than the first region.

The conductivity of the first region may be greater than that of the second region, and the first region may substantially serve as an electrode or a signal line. The second region may substantially correspond to an active region (or a channel) of a transistor. In other words, a portion of the semiconductor pattern may be an active region of a transistor, another portion may be a source or drain of a transistor, and still another portion may be a connection electrode or a connection signal line.

A source region SE1 (or a source), an active region AC1 (or a channel), and a drain region DE1 (or a drain) of the silicon transistor S-TFT may be formed from the first semiconductor pattern SP1. The source region SE1 and the drain region DE1 may extend in opposite directions from each other from the active region AC1 in a cross sectional view.

A first insulating layer 10 may be disposed on the buffer layer 120br. The first insulating layer 10 may overlap a plurality of pixels in common and cover the first semiconductor pattern. The first insulating layer 10 may be an inorganic layer and/or an organic layer, and have a single-layered or multi-layered structure. The first insulating layer 10 may contain at least one of aluminum oxide, titanium oxide, silicon oxide, silicon nitride, silicon oxynitride, zirconium oxide, or hafnium oxide. In this embodiment, the first insulating layer 10 may be a single-layered silicon oxide layer. The insulating layers of the circuit layer 120 to be described later as well as the first insulating layer 10 may be an inorganic layer and/or an organic layer, and have a single-layered or multi-layered structure. The inorganic layer may contain at least one of the above-described materials, but the embodiment of the inventive concept is not limited thereto.

The gate GT1 of the silicon transistor S-TFT is disposed on the first insulating layer 10. The gate GT1 may be a part of a metal pattern. The gate GT1 overlaps the active region AC1. In the process of doping the first semiconductor pattern SP1, the gate GT1 may function as a self-aligned mask. The gate GT1 may contain titanium (Ti), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), indium zinc oxide (IZO), and the like.

A second insulating layer 20 may be disposed on the first insulating layer 10 to cover the gate GT1. The second insulating layer 20 may be an inorganic layer and/or an organic layer, and have a single-layered or multi-layered structure. The second insulating layer 20 may contain at least one of silicon oxide, silicon nitride, or silicon oxynitride. In this embodiment, the second insulating layer 20 may have a multi-layered structure including a silicon oxide layer and a silicon nitride layer.

A third insulating layer 30 may be disposed on the second insulating layer 20. The third insulating layer 30 may have a single-layered or multi-layered structure. For example, the third insulating layer 30 may have a multi-layered structure including a silicon oxide layer and a silicon nitride layer. The second electrode CE2 (refer to FIG. 7A) of the storage capacitor Cst (refer to FIG. 7A) may be disposed between the second insulating layer 20 and the third insulating layer 30. In addition, the first electrode CE1 (refer to FIG. 7A) of the storage capacitor Cst (refer to FIG. 7A) may be disposed between the first insulating layer 10 and the second insulating layer 20.

A second semiconductor pattern SP2 may be disposed on the third insulating layer 30. The second semiconductor pattern SP2 may include an oxide semiconductor. The second semiconductor pattern SP2 may contain a transparent conductive oxide (TCO) such as indium tin oxide (ITO), indium zinc oxide (ILO), indium gallium zinc oxide (IGZO), zinc oxide (ZnO), or indium oxide (In$_2$O$_3$).

The oxide semiconductor may include a plurality of regions that include a reduced region and a non-reduced region. The reduced region of the transparent conductive oxide has greater conductivity than that of the non-reduced region of the transparent conductive oxide. The reduced region substantially serves as a source/drain or signal line of a transistor. The non-reduced region substantially corresponds to a semiconductor region (or active region or channel) of a transistor. In other words, a portion of the second semiconductor pattern SP2 may be a semiconductor region of a transistor, another portion thereof may be a source region/drain region of a transistor, and still another portion thereof may be a signal transmission region.

A source region SE2, an active region AC2, and a drain region DE2 of the oxide transistor O-TFT may be formed from the second semiconductor pattern SP2. The source region SE2 and the drain region DE2 may extend in opposite directions from each other from the active region AC2 in a cross sectional view.

A fourth insulating layer 40 may be disposed on the third insulating layer 30. The fourth insulating layer 40 may overlap a plurality of pixels in common and cover the second semiconductor pattern SP2. The fourth insulating layer 40 may contain at least one of aluminum oxide, titanium oxide, silicon oxide, silicon nitride, silicon oxynitride, zirconium oxide, or hafnium oxide. Alternatively, unlike what is illustrated, the fourth insulating layer 40 may overlap the gate GT2 of the oxide transistor O-TFT and be patterned to expose the source region SE2 and the drain region DE2 of the oxide transistor O-TFT.

The gate GT2 of the oxide transistor O-TFT is disposed on the fourth insulating layer 40. The gate GT2 may be a part of a metal pattern. The gate GT2 overlaps the active region AC2. In the process of doping the second semiconductor pattern SP2, the gate GT2 may function as a self-aligned mask.

A fifth insulating layer 50 may be disposed on the fourth insulating layer 40 to cover the gate GT2. The fifth insulating layer 50 may be an inorganic layer and/or an organic layer, and have a single-layered or multi-layered structure.

A first connection electrode CNE1 may be disposed on the fifth insulating layer 50. The first connection electrode CNE1 may be connected to the drain region DE1 of the silicon transistor S-TFT through a contact hole passing through the first to fifth insulating layers 10, 20, 30, 40, and 50.

A sixth insulating layer 60 may be disposed on the fifth insulating layer 50 to cover the first connection electrode CNE2. A second connection electrode CNE2 may be disposed on the sixth insulating layer 60. The second connection electrode CNE2 may be connected to the first connection electrode CNE1 through a contact hole passing through the sixth insulating layer 60. A seventh insulating layer 70 may be disposed on the sixth insulating layer 60 to cover the second connection electrode CNE2. A eighth insulating layer 80 may be disposed on the seventh insulating layer 70.

Each of the sixth insulating layer 60, the seventh insulating layer 70, and the eighth insulating layer 80 may be an organic layer. For example, each of the sixth insulating layer 60, the seventh insulating layer 70, and the eighth insulating layer 80 may contain a general-purpose polymer such as benzocyclobutene (BCB), polyimide, hexamethyldisiloxane (HMDSO), polymethylmethacrylate (PMMA), or polystyrene (PS), a polymer derivative having a phenol-based group, an acrylic-based polymer, an imide-based polymer, an arylether-based polymer, an amide-based polymer, a fluorine-based polymer, a p-xylene-based polymer, a vinyl alcohol-based polymer, and blends thereof.

The light-emitting element layer 130 including the first to third light-emitting elements LD1, LD2, and LD3 may be disposed on the circuit layer 120. The first light-emitting element LD1 may include a first electrode AE1, a first light-emitting layer EL1, and a second electrode CE (or a common electrode), the second light-emitting element LD2 may include a first electrode AE2, a second light-emitting layer EL2, and a second electrode CE, and the third light-emitting element LD3 may include a first electrode AE3, a third light-emitting layer EL3, and a second electrode CE. The second electrode CE of the first light-emitting element LD1 and the second light-emitting element LD2 may have an integral shape with the second electrode CE of the third light-emitting element LD3. That is, the second electrode CE may be provided in common to the first light-emitting element LD1, the second light-emitting element LD2, and the third light-emitting element LD3.

The first electrodes AE1, AE2, and AE3 may be disposed on the eighth insulating layer 80. The first electrodes AE1, AE2, and AE3 may be transflective electrodes or reflective electrodes. In an embodiment of the inventive concept, the first electrodes AE1, AE2, and AE3 may have a reflective layer formed of Ag, Mg, Al, Pt, Pd, Au, Ni, Nd, Ir, Cr, or a compound thereof, and a transparent or semi-transparent electrode layer formed on the reflective layer. The transparent or translucent electrode layer may include at least one material selected from the group consisting of indium tin oxide (ITO), indium zinc oxide (IZO), indium gallium zinc oxide (IGZO), zinc oxide (ZnO) or indium oxide (In$_2$O$_3$), and aluminum-doped zinc oxide (AZO). For example, the first electrodes AE1, AE2, and AE3 may include a three-layer structure of ITO/Ag/ITO.

A pixel defining layer PDL and a pixel defining pattern PDP may be disposed on the eighth insulating layer 80. The pixel defining layer PDL and the pixel defining pattern PDP may contain a same material and be formed through a same process. Each of the pixel defining layer PDL and the pixel defining pattern PDP may have a property of absorbing light. For example, each of the pixel defining layer PDL and the pixel defining pattern PDP may contain a black coloring agent. The black coloring agent may include a black dye and a black pigment, and may include, for example, carbon black, a metal such as chromium, or an oxide thereof.

The pixel defining pattern PDP may be disposed in the first region DP-A1. The pixel defining pattern PDP may cover a portion of the first electrode AE1. For example, the pixel defining pattern PDP may cover edges of the first electrode AE1. The pixel defining pattern PDP may have a ring shape in a plan view. However, the embodiment of the inventive concept is not limited thereto, and the pixel defining pattern PDP may have, for example, a rhombus shape or a rectangular shape in the plan view.

The pixel defining layer PDL may be disposed in the second region DP-A2 and the third region DP-A3. The pixel defining layer PDL may cover a portion of each of the first electrode AE2 and the first electrode AE3. For example, a first opening PDL-OP1 exposing a portion of the first electrode AE2 and a second opening PDL-OP2 exposing a portion of the first electrode AE3 may be defined in the pixel defining layer PDL.

The pixel defining pattern PDP may increase the distance between an edge of the first electrode AE1 and the second electrode CE, and the pixel defining layer PDL may increase the distance between an edge of each of the first electrodes AE2 and AE3 and the second electrode CE. Accordingly, the pixel defining pattern PDP and the pixel defining layer PDL may serve to prevent an arc from occurring at the edges of each of the first electrodes AE1, AE2, and AE3.

In the first region DP-A1, a region overlapping a portion, in which the first electrode AE1 and the pixel defining pattern PDP are disposed, may be defined as an element region EA, and the remaining region may be defined as a transmission region TA.

The first electrode AE1 may be electrically connected to the first pixel circuit PC1 disposed in the second region DP-A2. For example, the first electrode AE1 may be electrically connected to the silicon transistor S-TFT through connection electrodes CNE1' and CNE1, a connection bridge CPN, and a wiring layer TWL. In this case, the wiring layer TWL may overlap the transmission region TA. Accordingly, the wiring layer TWL may contain a light-transmitting material.

The wiring layer TWL includes a conductive portion CDP electrically connecting the first electrode AE1 and the first pixel circuit PC1 to each other and an insulating portion ISP disposed adjacent to the conductive portion CDP and having insulation properties. Each of the conductive portion CDP and the insulating portion ISP may contain a light-transmitting material. The conductive portion CDP may contain the transparent conductive polymer material described above. The insulating portion ISP may contain an insulation material converted from a conductive polymer material included in the conductive portion CDP. In an embodiment of the inventive concept, the conductive portion CDP may contain polyethylenedioxythiophene:polystyrenesulfonate (PEDOT:PSS), and the insulating portion ISP may contain an insulation material converted from polyethylenedioxythiophene:polystyrenesulfonate. The insulating portion ISP may contain an insulation material converted from the conductive polymer material and include an oxidized conductive polymer material that includes an oxidizing agent.

Each of the conductive portion CDP and the insulating portion ISP may contain a light-transmitting material so as to have a high light transmittance. In an embodiment of the inventive concept, each of the conductive portion CDP and the insulating portion ISP may have a light transmittance of about 85% or more in a visible light wavelength range. Each of the conductive portion CDP and the insulating portion ISP may have a light transmittance of about 85% or more within a wavelength range of about 380 nm to about 780 nm. Within the wavelength range of about 380 nm to about 780 nm, the difference between the transmittances of the conductive portion CDP and the insulating portion ISP may be less than about 5%.

The conductive portion CDP and the insulating portion ISP included in the wiring layer TWL may be provided as a single layer having an integral shape. The conductive portion CDP and the insulating portion ISP may be an integrally formed single layer. That is, the conductive portion CDP and the insulating portion ISP included in the wiring layer TWL may be disposed on a same insulating layer, which is the fifth insulating layer 50, and formed at the same time using the same process. Each of the conductive portion CDP and the insulating portion ISP may be different portions derived from a single layer. The conductive portion CDP may be a portion of a preliminary wiring layer TWL-P that does not include an insulation-imparting material (refer to FIG. 10A). The insulating portion ISP may be a portion of the preliminary wiring layer TWL-P (refer to FIG. 10A) that includes the insulation-imparting material.

The wiring layer TWL may be disposed between the fifth insulating layer 50 and the sixth insulating layer 60, but the embodiment of the inventive concept is not particularly limited thereto. The wiring layer TWL may be disposed between, for example, the fourth insulating layer 40 and the fifth insulating layer 50. The sixth insulating layer 60 may cover the wiring layer TWL. The connection bridge CPN may be disposed between the sixth insulating layer 60 and the seventh insulating layer 70. In this specification, the first insulating layer 10 to the fifth insulating layer 50 disposed under the wiring layer TWL may be referred to as a lower insulating layer and a sixth insulating layer 60 to the eighth insulating layer 80 may be referred to as an upper insulating layer.

A portion of the wiring layer TWL may be connected to the first pixel circuit PC1 through the connection bridge CPN and the connection electrode CNE1. The conductive portion CDP of the wiring layer TWL may be connected to the first pixel circuit PC1 through the connection bridge CPN and the connection electrode CNE1. At least one of the connection bridge CPN or the connection electrode CNE1 may be omitted. In an embodiment of the inventive concept, the connection bridge CPN may be omitted, and the conductive portion CDP may be directly connected to the connection electrode CNE1. That is, the conductive portion CDP may be electrically connected to the silicon transistor S-TFT by the connection electrode CNE1.

A portion of the wiring layer TWL may be connected to the first electrode AE1 by the connection electrode CNE1'. The conductive portion CDP of the wiring layer TWL may be connected to the first electrode AE1 by the connection electrode CNE1'. In an embodiment of the inventive concept, the connection electrode CNE1' may be omitted, and the conductive portion CDP may be directly connected to the first electrode AE1.

The wiring layer TWL may overlap the first region DP-A1 and partially overlap the second region DP-A2. The wiring layer TWL may not overlap the third region DP-A3 (refer to FIG. 7A).

The first light-emitting layer EL1 may be disposed on the first electrode AE1, the second light-emitting layer EL2 may be disposed on the first electrode AE2, and the third light-emitting layer EL3 may be disposed on the first electrode AE3. In this embodiment, each of the first to third light-emitting layers EL1, EL2, and EL3 may emit light of one of blue, red, or green.

The second electrode CE may be disposed on the first to third light-emitting layers EL1, EL2, and EL3. The second electrode CE may be commonly disposed in the plurality of pixels PX (refer to FIG. 5). The second electrode CE may be commonly disposed on the plurality of first pixels PX1, the plurality of second pixels PX2, and the plurality of third pixels PX3. By using an open mask, the second electrode CE may be commonly formed on each of the plurality of first pixels PX1, the plurality of second pixels PX2, and the plurality of third pixels PX3.

The second electrode CE may be a light-transmitting electrode. In an embodiment of the inventive concept, the second electrode CE may be a transparent or translucent electrode and may be formed with a metal thin film having a small work function and containing Li, Ca, LiF/Ca, LiF/Al, Al, Ag, Mg, and a compound thereof. In addition, a transparent conductive oxide (TCO) film containing ITO, IZO, ZnO, $In_2O_3$, or the like may be further disposed on the metal thin film.

Although not illustrated, a capping layer containing an organic material may be formed on the second electrode CE. The capping layer may be provided to protect the second electrode CE and increase light extraction efficiency. The capping layer may contain an organic material having a higher refractive index than the second electrode CE. Alternatively, the capping layer may be provided by stacking layers having different refractive indices. For example, the capping layer may be provided by stacking a high refractive index layer/a low refractive index layer/a high refractive index layer. In this case. the refractive index of the high refractive index layer may be about 1.7 or more, and the refractive index of the low refractive index layer may be about 1.3 or less. The capping layer may additionally contain LiF. Alternatively, the capping layer may additionally contain an inorganic insulating material such as silicon oxide ($SiO_2$) or silicon nitride ($SiN_x$).

Although not illustrated, a hole control layer may be disposed between the first electrodes AE1, AE2, and AE3 and the first to third light-emitting layers EL1, EL2, and EL3. The hole control layer may include a hole transport layer and may further include a hole injection layer. An electronic control layer may be disposed between the first to third light-emitting layers EL1, EL2, and EL3 and the second electrode CE. The electron control layer may include an electron transport layer and may further include an electron injection layer. By using an open mask, the hole control layer and the electron control layer may be formed in common in the plurality of pixels PX (refer to FIG. 5).

The encapsulation layer 140 may be disposed on the light-emitting element layer 130. The encapsulation layer 140 may include an inorganic layer 141, an organic layer 142, and an inorganic layer 143 that are sequentially stacked, but the layers constituting the encapsulation layer 140 are not limited thereto.

The inorganic layers 141 and 143 may protect the light-emitting element layer 130 from moisture and oxygen, and the organic layer 142 may protect the light-emitting element layer 130 from foreign substances such as dust particles. The inorganic layers 141 and 143 may include a silicon nitride layer, a silicon oxynitride layer, a silicon oxide layer, a titanium oxide layer, an aluminum oxide layer, or the like. The organic layer 142 may include an acrylic-based organic layer, but the embodiment of the inventive concept is not limited thereto.

The sensor layer 200 may be disposed on the display panel 100. The sensor layer 200 may be referred to as a sensor, an input sensing layer, or an input sensing panel. The sensor layer 200 may include a base layer 210, a first conductive layer 220, a sensing insulating layer 230, and a second conductive layer 240.

The base layer 210 may be disposed directly on the display panel 100. The base layer 210 may be an inorganic layer including at least any one of silicon nitride, silicon oxynitride, or silicon oxide. Alternatively, the base layer 210 may be an organic layer including an epoxy resin, an acrylic resin, or an imide-based resin. The base layer 210 may have a single-layered structure or a multi-layered structure stacked along the third direction DR3.

Each of the first conductive layer 220 and the second conductive layer 240 may have a single-layered structure or a multi-layered structure stacked along the third direction DR3. The first conductive layer 220 and the second conductive layer 240 may include conductive lines having a mesh-shaped sensing electrode. The conductive lines overlap the pixel defining pattern PDP and the pixel defining layer PDL, and do not overlap the first opening PDL-OP1, the second opening PDL-OP2, and openings PDP-OP. The sensing electrode including the first conductive layer 220 and the second conductive layer 240 overlaps at least the third region DP-A3 illustrated in FIG. 5.

The single-layered structure may include a metal layer or a transparent conductive layer. The metal layer may contain molybdenum, silver, titanium, copper, aluminum, or an alloy thereof. The transparent conductive layer may contain transparent conductive oxide such as indium tin oxide (ITO), indium zinc oxide (IZO), zinc oxide (ZnO), or indium zinc tin oxide (IZTO). In addition thereto, the transparent conductive layer may contain a conductive polymer such as PEDOT, metal nanowire, graphene, and the like.

The multi-layered structure may include metal layers. The metal layers may have, for example, a three-layer structure of titanium/aluminum/titanium. The multi-layered structure may include at least one metal layer and at least one transparent conductive layer.

The sensing insulating layer 230 may be disposed between the first conductive layer 220 and the second conductive layer 240. The sensing insulating layer 230 may include an inorganic film. The inorganic film may contain at least one of aluminum oxide, titanium oxide, silicon oxide, silicon nitride, silicon oxynitride, zirconium oxide, or hafnium oxide.

Alternatively, the sensing insulating layer 230 may include an organic film. The organic film may contain at least any one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, or a perylene-based resin.

An anti-reflection layer 300 may be disposed on the sensor layer 200. The anti-reflection layer 300 may include a partition layer 310, a first color filter 321, a second color filter 322, a third color filter 323, and a planarization layer 330.

A material constituting the partition layer 310 is not particularly limited as long as the material absorbs light. The partition layer 310 is a layer having a black color, and in an embodiment of the inventive concept, the partition layer 310 may contain a black coloring agent. The black coloring agent may contain a black dye and a black pigment. The black coloring agent may contain carbon black, a metal such as chromium, or an oxide thereof.

The partition layer 310 may cover the second conductive layer 240 of the sensor layer 200. The partition layer 310 may prevent external light from being reflected from the second conductive layer 240. The partition layer 310 may overlap the second region DP-A2 (refer to FIG. 5) and the third region DP-A3, and may not overlap the first region DP-A1 (refer to FIG. 5). That is, as the partition layer 310 is not disposed in the first region DP-A1 (refer to FIG. 5), the transmittance of the first region DP-A1 may be further improved.

A second opening 310-OP2 may be defined in the partition layer 310. The second opening 310-OP2 may overlap the first electrode AE3 of the third light-emitting element LD3. The third color filter 323 may overlap the third region DP-A3. The third color filter 323 may overlap the first electrode AE3 of the third light-emitting element LD3. The third color filter 323 may cover the second opening 310-OP2. The third color filter 323 may be in contact with the partition layer 310.

The planarization layer 330 may cover the partition layer 310 and the third color filter 323. The planarization layer 330 may contain an organic material and provide a flat surface to the upper surface of the planarization layer 330. In an embodiment of the inventive concept, the planarization layer 330 may be omitted.

FIGS. 8A and 8B are plan views illustrating a portion of the display device according to an embodiment of the inventive concept. FIG. 8C is a cross-sectional view of a portion of the display device according to an embodiment of the inventive concept. FIGS. 8A and 8B schematically illustrate some of the components disposed in the first region DP-A1 and the second region DP-A2 of the display panel 100 according to an embodiment of the inventive concept. FIG. 8C illustrates a cross section of the display device, which corresponds to line I-P of FIG. 8B.

Referring to FIGS. 8A to 8C, the first light-emitting element LD1 disposed in the first region DP-A1 and the first pixel circuit PC1 disposed in the second region DP-A2 may be electrically connected to each other. The first electrode AE1 included in the first light-emitting element LD1 may be electrically connected to the silicon transistor S-TFT of the first pixel circuit PC1. The first light-emitting element LD1 and the first pixel circuit PC1 may be electrically connected by a conductive portion CDP interposed therebetween. The conductive portion CDP may be a portion of the wiring layer TWL which has conductivity. The wiring layer TWL includes a conductive portion CDP electrically connecting the first light-emitting element LD1 and the first pixel circuit PC1 to each other and an insulating portion ISP other than the conductive portion CDP and connected the conductive portion CDP.

The wiring layer TWL may be provided as a single layer having an integral shape and overlap at least the first region DP-A1. In an embodiment of the inventive concept, the wiring layer TWL may be a single layer that overlaps the first region DP-A1. As illustrated in FIG. 8A, the wiring layer TWL may also overlap a portion of the second region DP-A2 disposed adjacent to the first region DP-A1. However, the embodiment of the inventive concept is not limited thereto, and the wiring layer TWL may overlap only the first region DP-A1 and may not overlap the second region DP-A2.

In an embodiment of the inventive concept, a connection bridge CPN may be provided between the wiring layer TWL and the first pixel circuit PC1, and the wiring layer TWL and the first pixel circuit PC1 may be connected to each other by the connection bridge CPN. The connection bridge CPN may electrically connect the conductive portion CDP of the wiring layer TWL and the first pixel circuit PC1 to each other. A connection electrode CNE1 (refer to FIG. 7B) may be provided between the first pixel circuit PC1 and the connection bridge CPN, and the connection bridge CPN may be connected to the first pixel circuit PC1 through the connection electrode CNE1 (refer to FIG. 7B).

Unlike what is illustrated in FIGS. 8A and 8B, the connection bridge CPN may be omitted. When the connection bridge CPN is omitted, the conductive portion CDP of the wiring layer TWL may be connected to the first pixel circuit PC1 through the connection electrode CNE1 (refer to FIG. 7B) or directly connected to the first pixel circuit PC1. When the connection bridge CPN is omitted, the wiring layer TWL may extend over the first pixel circuit PC1 to partially overlap the first pixel circuit PC1 in a plan view. The conductive portion CDP of the wiring layer TWL may extend to be directly connected to the connection electrode CNE1 (refer to FIG. 7B) connected to the silicon transistor S-TFT (refer to FIG. 7B) of the first pixel circuit PC1.

Each of the conductive portion CDP and the insulating portion ISP of the wiring layer TWL may contain a light-transmitting material. The conductive portion CDP may contain the transparent conductive polymer material described above. The insulating portion ISP may contain an insulation material converted from the conductive polymer material included in the conductive portion CDP. In an embodiment of the inventive concept, the conductive portion CDP may contain polyethylenedioxythiophene:polystyrenesulfonate (PEDOT:PSS), and the insulating portion ISP may contain an insulation material converted from polyethylenedioxythiophene:polystyrenesulfonate. The insulating portion ISP may contain an insulation material converted from the conductive polymer material and include the oxidized conductive polymer material that includes the oxidizing agent.

The conductive portion CDP and the insulating portion ISP included in the wiring layer TWL may be provided as a single layer having an integral shape. The conductive portion CDP and the insulating portion ISP included in the wiring layer TWL may be formed at the same time using the same process. The upper surface CDP-U of the conductive portion CDP and the upper surface ISP-U of the insulating portion ISP may define a continuous flat surface. As each of the conductive portion CDP and the insulating portion ISP is a portion derived from one layer, the conductive portion CDP and the insulating portion ISP may form a single layer having an integral shape without an interface between the conductive portion CDP and the insulating portion ISP.

In a display panel included in an electronic device according to an embodiment of the inventive concept, the first light-emitting element LD1 disposed in the first region DP-A1 and the first pixel circuit PC1 disposed in the second region DP-A2 are electrically connected to each other by the wiring layer TWL. The wiring layer TWL is not provided in the form of a separate independent wiring and is provided in the form of a single layer including the conductive portion CDP, which is a conductive portion of the wiring layer TWL, and the insulating portion ISP disposed adjacent to the conductive portion CDP. As the wiring layer TWL is provided in the form of a single layer including the conductive portion CDP and the insulating portion ISP, a diffraction phenomenon due to a difference in stack structure may not occur, and thus a problem, in which the performance of the electronic module CM (refer to FIG. 2) disposed to overlap the first region DP-A1 is degraded, may not occur.

Unlike the embodiment of the inventive concept, when a connecting wiring connecting the first light-emitting element and the first pixel circuit to each other is provided as a separate independent wiring, a step difference may be generated between a portion in which the wiring is disposed and a portion in which the wiring is not disposed, and a diffraction phenomenon may occur due to a difference in optical path, which is caused by the step difference. In addition, when the separate wiring is formed of a transparent conductive oxide such as ITO, a diffraction phenomenon may occur due to a difference in refractive index between the ITO wiring and the material of an insulating layer. Accordingly, the performance of the electronic module disposed to overlap the first region may be degraded. For example, when the electronic module is a camera module, the resolution of an image captured by the camera module may be reduced, and a light spreading phenomenon may occur.

In the display panel included in the electronic device according to an embodiment of the inventive concept, the wiring layer TWL may be provided in the form of a single layer including the conductive portion CDP and the insulating portion ISP, and each of the conductive portion CDP and the insulating portion ISP may contain a same base material since the conductive portion CDP and the insulating portion ISP is derived from a preliminary wiring layer formed of a conductive polymer material. As the wiring layer TWL provided as a single layer does not cause a step difference, a diffraction phenomenon may be prevented, and as each of the conductive portion CDP and the insulating portion ISP may have an integral shape containing a same base material, a diffraction phenomenon which may be generated from the interface between the conductive portion CDP and the insulating portion ISP may also be suppressed. Accordingly, the display panel and the electronic device including the wiring layer TWL according to an embodiment of the inventive concept may prevent the deterioration of the performance of the electronic module CM disposed to overlap the first region DP-A1.

FIG. 9 is a graph showing transmittances for each wavelength of a conductive portion and an insulating portion included in the wiring layer according to an embodiment of the inventive concept.

Referring to FIG. 9, it can be seen that each of the conductive portion and the insulating portion has a high transmittance of 85% or more within a wavelength range of about 380 nm to about 780 nm, which belongs to a visible light wavelength range and a wavelength rage adjacent to the visible light wavelength range. In addition, it can be seen that within the wavelength range of about 380 nm to about 780 nm, the difference between the transmittances of the conductive portion and the insulating portion is less than 5%, and in particular, within the wavelength range of about 430 nm to about 680 nm, the difference between the transmittances of the conductive portion and the insulating portion is less than 1% which is a very small value. Since each of the conductive portion and the insulating portion has a high transmittance in a visible light wavelength range and in a wavelength range adjacent to the visible light wavelength range, the performance of the electronic module may not be deteriorated although the wiring layer is disposed in the first region in which the electronic module is disposed. In addition, since the difference in transmittance between the conductive portion and the insulating portion is small in a visible light wavelength range and in a wavelength range adjacent to the visible light wavelength range, a diffraction phenomenon does not occur at the interface between the conductive portion and the insulating portion, so that the performance of the electronic module may not be deteriorated.

FIGS. 10A to 10E are cross-sectional views illustrating some steps of fabricating the display device according to an embodiment of the inventive concept. FIGS. 10A to 10E illustrate the cross sections of some of portions corresponding to FIG. 8C in some of the steps of fabricating the display device.

The method of fabricating the display device according to an embodiment of the inventive concept includes forming a first transistor overlapping the second region, forming second to fifth insulating layers on the first transistor, forming a wiring layer on the fifth insulating layer, and forming a first light-emitting element which is electrically connected to the wiring layer on the second insulating layer.

Referring to FIG. 7B, in the method of fabricating the display device according to an embodiment of the inventive concept, the silicon transistor S-TFT (or first transistor) including the first insulating layer 10 and overlapping the second region DP-A2 is formed, and then the second to fifth insulating layers 20, 30, 40, and 50 (or lower insulating layers) covering the silicon transistor S-TFT is formed. Thereafter, the wiring layer TWL is formed on the fifth insulating layer 50, and the first light-emitting element LD1, which is electrically connected to a portion of the wiring layer TWL, is formed on the eighth insulating layer 80.

Referring to FIGS. 7B, 8C, 10A, and 10B, the forming of the wiring layer TWL includes coating the fifth insulating layer 50 including a conductive polymer to form a preliminary wiring layer TWL-P. The preliminary wiring layer TWL-P may be formed to entirely cover the first region DP-A1, the second region DP-A2 and the third region DP-A3.

The conductive polymer material forming the preliminary wiring layer TWL-P may be a light-transmitting material. For example, the conductive polymer material may contain at least any one of polyethylenedioxythiophene (PEDOT), polythiophene, polyaniline, polypyrrole, or polyacetylene. The conductive polymer material may contain polyethylenedioxythiophene:polystyrenesulfonate (PEDOT:PSS).

Referring to FIGS. 7B, 8C, 10B, and 10C, the forming of the wiring layer TWL includes forming a mask pattern PR on the preliminary wiring layer TWL-P and applying an insulation-imparting material ISM onto the preliminary wiring layer TWL-P.

The mask pattern PR may be a photoresist pattern. The mask pattern PR may include a positive photoresist or a negative photoresist. The mask pattern PR may include mask openings which expose the preliminary wiring layer TWL-P so as to partially apply the insulation-imparting material ISM onto the preliminary wiring layer TWL-P which is exposed by the mask openings. The mask pattern PR may be formed on a portion in which the conductive portion CDP of the wiring layer TWL is formed through a subsequent process. The mask opening in the mask pattern PR may be formed on a portion in which the insulating portion ISP of the wiring layer TWL is formed.

In the step of applying the insulation-imparting material ISM, the insulation-imparting material ISM may be applied onto the preliminary wiring layer TWL-P which is exposed by the mask opening so as to form the insulating portion ISP. The conductive portion CDP may be formed in a portion which is covered by the mask pattern PR so that the insulation-imparting material ISM cannot be applied thereto.

The insulation-imparting material ISM may be a material that converts the preliminary wiring layer TWL-P which is a conductive polymer material into an insulator by denaturalizing the conductive polymer material. In an embodiment of the inventive concept, the insulation-imparting material ISM may be an oxidizing agent that oxidizes the conductive polymer material. The conductive polymer material may contain, for example, polyethylenedioxythiophene (PEDOT), and the insulation-imparting material ISM may oxidize a thiophenyl moiety included in a polyethylenedioxythiophene skeleton to transform polyethylenedioxythiophene, which is a conductor, into a nonconductor.

Referring to FIGS. 7B, 8C, and 10C to 10E, the method may further include removing the mask pattern PR after the forming of the wiring layer TWL. After the mask pattern PR is removed, the sixth insulating layer 60, the connection electrode CNE1', the seventh insulating layer 70, the eighth insulating layer 80, and the first electrode AE1 may be sequentially formed on the wiring layer TWL. Although not illustrated in FIG. 10E, the first light-emitting layer EL1 and the second electrode CE may be sequentially formed on the first electrode AE1 so as to form the first light-emitting element LD1. Accordingly, the first light-emitting element LD1 and the conductive portion CDP may be electrically connected to each other.

In the method of fabricating the display device according to an embodiment of the inventive concept, in the step of forming a wiring layer connecting a first light-emitting element disposed in the first region and a first transistor disposed in the second region to each other, a preliminary wiring layer is formed by using a conductive polymer material, and then an insulation-imparting material is applied onto a portion of the preliminary wiring layer so as to form an insulating portion, and a portion to which the insulation-imparting material is not applied becomes a conductive portion by which the first light-emitting element and the first transistor are connected to each other. Accordingly, as the wiring layer is provided in the form of a single layer rather than in the form of a separate independent wiring, a diffraction phenomenon due to a difference in stack structure may not occur, and thus a problem, in which the performance of the electronic module disposed to overlap the first region is degraded, may not occur.

According to an embodiment of the inventive concept, as a problem, in which light is diffracted by the connection electrode included in the display device, is prevented, the quality of a signal received from the electronic module disposed under the display device or a signal output from the electronic module may be improved. Accordingly, the reliability of the electronic device including the electronic module may be improved.

Although the above has been described with reference to embodiments of the present inventive concept, those skilled in the art or those of ordinary skill in the art will understand that the present inventive concept may be variously modified and changed within the scope not departing from the spirit and technical scope of the present inventive concept described in the claims to be described later. Therefore, the technical scope of the present inventive concept should not be limited to the contents described in the detailed description of the specification, but should be determined by the claims below.

What is claimed is:

1. A display device comprising a display panel, the display panel comprising:
    a base layer comprising a display region, which comprises a first region and a second region disposed adjacent to the first region, and a peripheral region disposed adjacent to the display region;
    a plurality of insulating layers disposed on the base layer; and
    a first pixel and a second pixel which are disposed on the base layer,
    wherein:
    the first pixel comprises a first light-emitting element disposed in the first region, a first pixel circuit electrically connected to the first light-emitting element, and a wiring layer disposed on at least one insulating layer among the plurality of insulating layers and containing a conductive polymer;
    the second pixel comprises a second light-emitting element disposed in the second region and a second pixel circuit electrically connected to the second light-emitting element and disposed in the second region; and
    the wiring layer comprises a conductive portion which electrically connects the first pixel circuit and the first light-emitting element and an insulating portion disposed adjacent to the conductive portion.

2. The display device of claim 1, wherein the conductive polymer comprises at least one of polyethylenedioxythiophene (PEDOT), polythiophene, polyaniline, polypyrrole, or polyacetylene.

3. The display device of claim 1, wherein:
    the conductive portion comprises the conductive polymer, and
    the insulating portion comprises an insulation material which is an oxidized conductive polymer.

4. The display device of claim 1, wherein the difference between the transmittance of the conductive portion and the transmittance of the insulating portion is less than about 5%.

5. The display device of claim 1, wherein:
the conductive portion and the insulating portion are disposed on the same layer using a same process; and
the upper surface of the conductive portion and the upper surface of the insulating portion define a flat surface.

6. The display device of claim 1, wherein, in the wiring layer, the conductive portion and the insulating portion are an integrally formed single layer.

7. The display device of claim 1, wherein the plurality of insulating layers comprise:
a lower insulating layer disposed under the wiring layer; and
an upper insulating layer disposed above the wiring layer and covering the wiring layer.

8. The display device of claim 7, wherein:
the first pixel circuit further comprises a transistor disposed in the second region and a connection electrode electrically connected to the transistor; and
a portion of the connection electrode is disposed on the upper insulating layer and connected to the conductive portion through a contact hole passing through the upper insulating layer.

9. The display device of claim 8, wherein:
the transistor comprises a semiconductor pattern disposed under the lower insulating layer and including a drain region, an active region, and a source region; and
the conductive portion is electrically connected to the semiconductor pattern.

10. The display device of claim 7, wherein:
the first light-emitting element comprises a first electrode disposed on the upper insulating layer, a light-emitting layer disposed on the first electrode, and a second electrode disposed on the light-emitting layer; and
the conductive portion is electrically connected to the first electrode.

11. The display device of claim 1, wherein:
the display region further comprises a third region disposed adjacent to the second region;
the display panel further comprises a third pixel disposed in the third region;
the third pixel comprises a third light-emitting element disposed in the third region and a third pixel circuit electrically connected to the third light-emitting element and disposed in the third region; and
the number of the second light-emitting elements disposed in a unit area is smaller than the number of the third light-emitting elements disposed in the unit area.

12. The display device of claim 1, wherein the wiring layer overlaps the first region.

13. An electronic device comprising:
a display device comprising a display region, which comprises a first region through which an optical signal passes and a second region disposed adjacent to the first region, and a peripheral region disposed adjacent to the display region; and
an electronic module which is disposed under the display device, overlaps the first region, and receives the optical signal,
wherein:
the display device comprises a base layer, a plurality of insulating layers disposed above the base layer, and a first pixel disposed on the base layer;
the first pixel comprises a first light-emitting element disposed in the first region, a first pixel circuit electrically connected to the first light-emitting element, and a wiring layer disposed on at least one insulating layer among the plurality of insulating layers and comprising a conductive polymer; and
the wiring layer comprises a conductive portion, which electrically connects the first pixel circuit and the first light-emitting element, and an insulating portion disposed adjacent to the conductive portion.

14. The electronic device of claim 13, wherein:
the conductive portion comprises the conductive polymer; and
the insulating portion comprises an insulation material which is an oxidized conductive polymer.

15. The electronic device of claim 13, wherein:
the conductive portion and the insulating portion are disposed on the same layer using a same process; and
the upper surface of the conductive portion and the upper surface of the insulating portion define a flat surface.

16. The electronic device of claim 13, wherein the electronic module comprises a camera module.

* * * * *